US012776475B2

(12) United States Patent
Statham et al.

(10) Patent No.: US 12,776,475 B2
(45) Date of Patent: Oct. 27, 2026

(54) NAVIGATION FOR ELECTRON MICROSCOPY

(71) Applicant: Oxford Instruments Nanotechnology Tools Limited, High Wycombe (GB)

(72) Inventors: Peter Statham, High Wycombe (GB); Philippe Pinard, High Wycombe (GB)

(73) Assignee: Oxford Instruments Nanotechnology Tools Limited, High Wycombe (GB)

( * ) Notice: Subject to any disclaimer, the term of this patent is extended or adjusted under 35 U.S.C. 154(b) by 334 days.

(21) Appl. No.: 18/580,555

(22) PCT Filed: Jul. 25, 2022

(86) PCT No.: PCT/GB2022/051946
§ 371 (c)(1),
(2) Date: Jan. 18, 2024

(87) PCT Pub. No.: WO2023/002226
PCT Pub. Date: Jan. 26, 2023

(65) Prior Publication Data

US 2024/0339293 A1 Oct. 10, 2024

(30) Foreign Application Priority Data

Jul. 23, 2021 (GB) ...................................... 2110622
Jul. 28, 2021 (GB) ...................................... 2110846

(51) Int. Cl.
*H01J 37/28* (2006.01)
*H01J 37/22* (2006.01)
*H01J 37/244* (2006.01)

(52) U.S. Cl.
CPC ............ *H01J 37/28* (2013.01); *H01J 37/222* (2013.01); *H01J 37/244* (2013.01); *H01J 2237/2817* (2013.01)

(58) Field of Classification Search
CPC ........ H01J 37/28; H01J 37/222; H01J 37/244; H01J 2237/2817; H01J 2237/24495;
(Continued)

(56) References Cited

U.S. PATENT DOCUMENTS 5,357,110 A 10/1994 Statham
6,633,034 B1 * 10/2003 Crewe .................. H01J 37/244 250/397
(Continued)

FOREIGN PATENT DOCUMENTS

CH 691006 A5 * 3/2001 ............... G01T 1/22
CN 120908220 A * 11/2025 ............. H01J 37/28
(Continued)

OTHER PUBLICATIONS

Dufek, Martin, The Quanta FEG User Operation Manual, FEI Company, 4022 290 22214, 3rd Edition, Jan. 30, 2007, Copyright © 2007, 192 pages.
(Continued)

*Primary Examiner* — David A Vanore
(74) *Attorney, Agent, or Firm* — BLANK ROME LLP

(57) ABSTRACT

A method for analyzing a specimen in a microscope is described. The method comprises: acquiring a series of compound image frames using a first detector and a second detector, different from the first detector and displaying the series of compound image frames in real-time on a visual display, wherein the visual display is updated to show each compound image frame in sequence. Acquiring a compound image frame comprises: causing a charged particle beam to traverse a region of a specimen, the region corresponding to a configured field of view of the microscope, wherein: when a mode parameter has a first value, the traversal of the beam is along a first traversal path on the region and is according
(Continued)

to a first set of traversal conditions, and when the mode parameter has a second value, the traversal of the beam is along a second traversal path on the region and is according to a second set of traversal conditions, wherein a first total time required for the beam to traverse the entire first traversal path according to a first set of traversal conditions is less than a second total time required for the beam to traverse the entire second traversal path according to the second set of traversal conditions; monitoring a first set of resulting particles generated within the specimen at a first plurality of locations within the region using the first detector so as to obtain a first image frame, the first image frame comprising a plurality of pixels corresponding to, and having values derived from the monitored particles generated at, the first plurality of locations, monitoring a second set of resulting particles generated within the specimen at a second plurality of locations within the region using the second detector, so as to obtain a second image frame, the second image frame comprising a plurality of pixels corresponding to, and having respective sets of values derived from the monitored particles generated at, the second plurality of locations, and combining the first image frame and the second image frame so as to produce the compound image frame, such that the compound image frame provides data derived from particles generated at the first and second pluralities of locations within the region and monitored by each of the first detector and the second detector.

22 Claims, 7 Drawing Sheets

(58) Field of Classification Search
CPC ....... H01J 2237/2807; H01J 2237/2813; H01J 37/265; H01J 2237/221; G01N 2223/079; G01N 2223/401; G01N 2223/418; G01N 2223/426; G01N 23/2251; G01N 23/2252
See application file for complete search history.

(56) References Cited

U.S. PATENT DOCUMENTS 7,095,023 B2 * 8/2006 Nagano ................. H01J 37/244
250/310
8,624,186 B2 * 1/2014 Wang ...................... H01J 37/28
250/397
9,761,409 B2 * 9/2017 Nomaguchi ............ H01J 37/30
9,855,444 B2 * 1/2018 Penfold .................. A61B 6/032
11,276,547 B2 * 3/2022 Essers ................... H01J 37/145
11,688,582 B2 * 6/2023 Hyde ...................... H01J 37/28
250/311
2006/0291619 A1 * 12/2006 Statham ................. G01N 23/22
378/45
2008/0027676 A1 * 1/2008 Statham .................... G01J 3/28
702/179
2010/0017172 A1 * 1/2010 Statham ............. G01N 23/2252
703/2
2010/0163725 A1 * 7/2010 Barkshire ............ H01J 37/256
250/307
2012/0138795 A1 * 6/2012 Nakazawa ........... H01J 37/256
348/80
2014/0035943 A1 * 2/2014 Statham ................ G06T 11/001
345/593
2016/0093468 A1 * 3/2016 Lang ..................... H01J 37/304
216/59
2017/0097574 A1 * 4/2017 Goodwin ............. G01J 1/0448
2021/0151287 A1 * 5/2021 Hyde ....................... H01J 37/28
2023/0258587 A1 * 8/2023 Burgess ............... G01N 23/203
250/307
2024/0241068 A1 * 7/2024 Hyde ..................... H01J 37/244
2024/0339293 A1 * 10/2024 Statham ................ H01J 37/265
2025/0087449 A1 * 3/2025 Statham .................. H01J 37/05
2025/0132121 A1 * 4/2025 Bardy ................... H01J 37/141

FOREIGN PATENT DOCUMENTS

| | | | | | |
|---|---|---|---|---|---|
| EP | 3174085 | A1 | * | 5/2017 | .............. H01J 37/28 |
| EP | 3985711 | A1 | * | 4/2022 | .............. H01J 37/28 |
| EP | 4064323 | A1 | * | 9/2022 | .......... H01J 37/2955 |
| EP | 4575476 | A1 | * | 6/2025 | ......... G01N 23/2204 |
| GB | 2071403 | A | * | 9/1981 | ............ H01J 37/244 |
| JP | 2020-34420 | A | | 3/2020 | |
| JP | 2020-527839 | A | | 9/2020 | |
| WO | WO-2008155560 | A1 | * | 12/2008 | ............ H01J 37/244 |
| WO | 2012110754 | A1 | | 8/2012 | |
| WO | 2014188186 | A1 | | 11/2014 | |
| WO | 2019016559 | A1 | | 1/2019 | |
| WO | WO-2020136044 | A2 | * | 7/2020 | ............ H01J 37/265 |
| WO | WO-2023002226 | A1 | * | 1/2023 | ............ H01J 37/244 |

OTHER PUBLICATIONS

Statham, Peter J., Deconvolution and Background Subtraction by Least-Squares Fitting with Prefiltering of Spectra, Department of Electrical Engineering and Computer Sciences, University of California, Berkeley, California 94720, Analytical Chemistry, vol. 49, No. 14, Dec. 1977.

Reimer, Ludwig, Scanning Electron Microscopy, Physics of Image Formation and Microanalysis, Physikalisches Institut, Westfälische Wilhelms-Universität Munster, Domagkstraße 75, D-4400 Münster, Fed. Rep. of Germany, ISBN 3-540-13530-8 Springer-Verlag Berlin Heidelberg New York Tokyo, ISBN 0-387-13530-8 Springer-Verlag New York Heidelberg Berlin Tokyo, p. 221.

Mott, R.B. et al., Saving the photons: mapping X-rays by position-tagged spectrometry, Princeton Gamma-Tech, Inc., CN 863, Princeton, NJ 08542, USA, Journal of Microscopy, vol. 193, Pt 1, Jan. 1999, pp. 2-14, © 1999 The Royal Microscopical Society.

Wikipedia, Digital image correlation and tracking, pp. 1-6, https://en.whikipedia.org/wiki/Digital_Image_correlation_and_tracking, retrieved from https://en.wikipedia.org/w/index.php?title=Digital_image_correlation_and_tracking&oldid=1179001908.

International Search Report, mail date Oct. 1, 2023, 6 pages, received in corresponding PCT application No. PCT/GB2022/051946.

* cited by examiner

NAVIGATION FOR ELECTRON MICROSCOPY

This application is a national stage filing of PCT Application No. PCT/GB2022/051946 filed on Jul. 25, 2022, which claims the benefit of both GB Application No. 2110622.4, filed on Jul. 23, 2021, and GB Application No. 2110846.9, filed on Jul. 28, 2021, all of which are hereby incorporated by reference in their entirety.

FIELD OF THE INVENTION

The present invention relates to a method for analyzing a specimen in a microscope, and to a system for analyzing a specimen. In particular it may provide a user with improved navigation around the specimen, and may help a user by combining information from multiple signals, even those with poor signal-to-noise, and providing a display that allows the user to interact with the information sources in order to explore over a large area efficiently and effectively.

BACKGROUND TO THE INVENTION

FIG. 2 shows a typical system that is employed in a scanning electron microscope (SEM) for exploring the surface of a specimen. The electron beam is produced inside an evacuated chamber and usually focused with a combination of magnetic or electrostatic lenses. When the beam strikes a specimen, some electrons are scattered back from the specimen (backscattered electrons or BSE) or interact with the specimen to produce secondary electrons (SE) and a number of other emissions such as X-rays.

An electron detector, typically designed to respond to the intensity of either SE or BSE from the specimen, is connected to signal processing electronics and produces a signal corresponding to that part of the specimen that is being struck by the focused beam. X-ray photons emitted from that part of the specimen will also strike an X-ray detector and with associated signal processing, individual photon energies can be measured and signals generated that correspond to the characteristic emission lines for chemical elements present under the beam. The focused electron beam is scanned using a beam deflector over the surface of the specimen to traverse a region that defines the field of view, FOV, of the specimen surface that will be shown as a visual image. This traverse is typically done in "raster" fashion where the beam position is driven along a line in the X direction of a Cartesian coordinate system and at the end of the line, the position is driven rapidly ("flyback") to the beginning of the next line that is a small increment in the Y direction further down the region. Thus, the region is scanned line-by-line until the beam traverses the full region to cover the FOV. When the beam is scanning along a line within the FOV, the signal from an electron detector can be electronically filtered and sampled at regular periods Te, or integrated for regular periods Te, to give a result representative of the specimen surface covered within each period. If the FOV is covered by a raster with Ny lines, and each line within the FOV takes time L, then the total number of results recorded will be Ny×L/Te. Each result constitutes a value for a pixel in a digital image where the total number of pixels, Npe=Ny×L/Te, for each full frame of data covering the FOV. When this digital image frame is sent to a visual display unit, the pixel values control the brightness and the pixel positions on the display correspond to the positions on the specimen surface for the individual results. Thus, if the visual display unit is much larger than the FOV on the specimen, the displayed image will show a greatly magnified region of the surface of the specimen and the "magnification" or "MAG" is formally the ratio of width of the visual display screen to width of the area scanned on the specimen surface. The microscope or SEM visualises a field of view of a region on the specimen surface that is governed by the electron beam energy, electron lens settings, fields applied to deflect the focused electron beam, and distance from the specimen surface to the final lens. The visual display monitor would normally show the largest image possible, alongside other controls and information for the graphical user interface. This largest image of the field of view on the specimen corresponds to the microscope configuration where the electron beam scans over the full field of view. If the electron beam is scanned slowly, the signal-to-noise for the electron image is better, but the display update rate is slow. When the user wants to adjust the focus or astigmatism to get a better image, a fast image update with good S/N is required. Therefore, many SEMs provide a "reduced raster" capability that retains the slow scan rate but scans over a reduced area on the specimen and the result is shown on correspondingly reduced area on the visual display. Thus, the magnification and S/N are retained but the display update rate is much faster. In this way, the "reduced raster" produces a modified, smaller field of view which is effectively a subsection at the centre of the image of the configured field of view that updates fast enough to allow interactive adjustment of focus and astigmatism.

Besides the conventional "raster" scan, there are many other methods by which the focused beam can traverse the FOV at the required spatial resolution for an image. A common method is to use an "interlaced raster" scan where, to collect data for Ny lines requires two passes through the region where in the first pass the beam is directed first along a line then misses out the line below and this is repeated until the Ny/2 "even numbered" lines have been covered then, in a second pass, the beam is directed along all the lines that have been missed out to cover the remaining Ny/2 lines that are required for a full traverse of the FOV. In another example, the beam could be driven along a "serpentine" path as shown in FIG. 1. With this type of traverse, if an electron signal measurement is taken for a period Te, then the beam path during this period can be arranged to traverse a small rectangular region that will correspond to a pixel in the acquired digital image frame. If the pixel value obtained in this period is used to control the brightness of an equivalent rectangular region on the visual display unit, the brightness will be more representative of that region than for a conventional raster where there are gaps between the continuous scan lines in the Y direction.

While the electron beam traverses the FOV and electron signal measurements are recorded, a histogram of X-ray photon energy measurements equivalent to an X-ray energy spectrum can be acquired for a period Tx to obtain a set of values that are representative of the region on the specimen surface that was traversed during the period Tx. By repeating this acquisition at regular intervals Tx, while the beam traverses the FOV, sets of pixel values can be obtained for a single frame of a "spectrum image" where each pixel has a set of values representing the X-ray spectrum emitted from the region traversed during a period Tx. If Tx=Te, the number of pixels in the X-ray spectrum image, Npx=Npe. However, if Tx>Te, Npx<Npe and each pixel in the X-ray spectrum image will be representative of a larger area on the specimen surface than for a pixel in the digital electron image.

In an alternative scanning strategy, the focused electron beam is held at one position in a rectangular grid of Npe points covering the FOV and the electron signal is measured for a period Te and the result stored in the corresponding pixel of a digital image When this process is repeated for every point in the rectangular grid, one complete "frame" of electron image data containing Npe pixels has been acquired. If a pixel value is used to control the brightness of a rectangular region on the visual display unit that corresponds to the equivalent rectangular region centred on the beam position on the specimen surface, the displayed image will be a magnified image of the FOV on the specimen surface. If the incident electron beam is slightly defocussed so that the beam spot covers the area between grid points, the value for each pixel in the digital electron image will represent an average signal value over the area in the vicinity of each beam position so that in a single frame, signals will have been obtained from the full area of the FOV on the specimen surface rather than from a grid of discrete positions. While the beam is positioned at a point, an X-ray spectrum can also be acquired for a time Tx that may be more or less than Te. As the beam is positioned at all Npe grid positions, a single frame of an X-ray spectrum image can be acquired with Npe pixels where each pixel has a set of values corresponding to the histogram of photon energies obtained at the corresponding position or small area in the vicinity of that position on the specimen surface. Alternatively, if the beam is positioned sequentially at grid points along a serpentine path, it is possible for an X-ray spectrum to continue to be acquired for a period Tx while the beam is positioned at a series of grid positions along the path. If an electron signal measurement is taken at every point while the X-ray spectrum is acquired for a series of points, a single pixel in the X-ray spectrum image can correspond to a rectangular region on the specimen covering many grid positions, whereas every pixel in the digital electron image corresponds to a grid point on the specimen surface.

In another strategy for acquiring signals, the beam is positioned at a series of points on a grid covering the FOV and both electron signal measurements and X-ray spectra are recorded at every point on the grid. The X-ray spectra from groups of points covering a small rectangular area on the specimen are then summed to give a single spectrum for each small rectangular area. Thus, the obtained X-ray spectrum image will contain fewer pixels than the digital electron image where each pixel in the X-ray spectrum image corresponds to a larger area on the specimen surface than a pixel in the digital electron image.

In another variant of interlacing, the beam is also positioned at a series of Npe points on a rectangular grid covering the FOV region of the specimen. However, the order of the points on which the beam is positioned is arranged so that the beam is first positioned on Npe/4 grid points covering the full FOV region, then the beam is positioned on a different set of Npe/4 grid points covering the full FOV region and this process is repeated 4 times until the beam has been positioned on all Npe grid points to complete the full traverse of the region. This can be thought of as the beam passing over the full FOV 4 times, each time visiting positions on 4 coarser sub grids with twice the point spacing but the total time to complete a full resolution traverse of the FOV is still the same as if the beam was positioned on every grid point in single pass through the region. This variant is sometimes referred to as 2×2 interlacing.

The above examples are not exhaustive but are intended to show that when the electron beam traverses a region of the specimen surface corresponding to a field of view, it is possible to obtain a single frame for a digital electron image containing Ne pixels and a single frame of an X-ray spectrum image containing Nx pixels from the same field of view where Nx is typically less than or equal to Ne.

Typically a "field of view" on a SEM is up to 1 cm in dimension but this can be larger or considerably smaller and if the digital image is displayed on a fixed size monitor, the size of the field of view effectively determines the magnification so that a smaller field of view represents higher magnification. A specimen to be examined is typically much larger in dimension than the maximum field of view that can be achieved by deflection of the electron beam and to explore the complete specimen surface it is usually necessary to move the holder or stage that supports the specimen using a controller and this can typically move the scanned field of view by many cm. A similar system is used in an electron microscope where the specimen is thin enough for the beam to be transmitted through the specimen (scanning transmission electron microscope or STEM). In this case, the range of beam deflection and stage movement is typically less than that for a SEM.

When an electron beam strikes a specimen, the number of electrons emitted from the specimen is typically a few orders of magnitude higher than the number of X-ray photons generated. Consequently, any X-ray images derived from the acquired X-ray data generally have much poorer signal-to-noise (S/N) ratio than the electron image and it is desirable to use the best available methods to improve the X-ray images. The number of X-rays collected by a detector is governed by the solid angle subtended by the X-ray detector at the point where the electron beam strikes the specimen. For an arrangement as shown in FIG. 2 where the X-ray detector is to one side of the electron beam, the collection solid angle is maximised by using a large area detector or positioning the detector very close to the specimen. In a different arrangement, the X-ray detector uses a number of sensors that are disposed around the incident electron beam to maximise the total collection solid angle. In this "coaxial" arrangement, the X-ray detector is positioned between the final lens aperture and specimen and the electron beam travels through a gap between the sensors.

Even when the collection solid angle is maximised, the signal-to-noise for derived X-ray images for a single frame is typically much worse than for the electron image and this makes it difficult for the user to see detail in a single image frame when the dwell time per pixel is short. If the dwell time is extended to improve signal-to-noise, the time to complete an image frame is increased and the user has to wait longer to see an image that covers the whole field of view. A significant innovation for X-ray imaging was the technique of recording both the scan position and energy of individual photons so that the stored data could be processed to generate X-ray images from any desired characteristic chemical element emission (Mott and Friel, 1999, Journal of Microscopy, Vol. 193, Pt 1, January 1999, pp. 2-14). Rather than use a large dwell time per pixel for a single scan, Mott and Friel used a small dwell time and repetitively scanned the same field of view while continually accumulating data. Their system was programmed to repetitively prepare X-ray images for display using the accumulated spectral data at each pixel so that as new frames of data were added, the derived X-ray element maps appeared progressively less grainy as the S/N improved. This method of acquiring X-ray data and displaying derived X-ray element maps and observing the resulting images improve with time has now been in common use for almost two decades.

When a user needs to explore a specimen to find interesting regions, they typically use the SEM display that has been optimised for fast interaction with electron images. The SEM usually displays a high S/N electron image that is refreshed every frame and uses a fast frame rate so that if the focus or magnification is changed or the field of view is shifted (for example by moving the holder or stage that supports the specimen or adding an offset to the scan deflection) the user sees the new image at a rate fast enough to interact efficiently. An update rate high enough to track a moving feature is typically referred to as "TV rate" by analogy with a domestic television even though the frame rate may be lower than 50 Hz. After setting the magnification of the electron image so that the field of view covered by the electron beam scan is suitable for displaying the type of features of interest on the specimen surface, the user will move the stage while observing the electron image to find an area that is likely to contain chemical elements or compounds that are of interest. When a likely area appears in the field of view, the user will stop stage movement then adjust the scan rate and start an X-ray acquisition and observe the element maps as the S/N improves frame by frame as described by Mott and Friel. If it soon becomes apparent that the distribution of elements or compounds in the field of view is not suitable, the user will return to interactive exploring using a fast frame rate electron image and moving the stage to find a more suitable region for acquiring X-ray data. This cycle of returning to the electron image to explore, periodically stopping to acquire sufficient X-ray data to check if the field of view has a suitable distribution of required elements and if not, returning to the electron image to explore, is inefficient and the user may also miss regions on the specimen that contain the materials of interest while they attempt to navigate over a large area on the specimen.

When the task of a user is to find regions containing particular chemical elements or compounds or materials with certain properties, the problem is that the electron image does not provide enough information. The SE signal shows up surface topography well and the BSE signal can indicate average atomic number of materials but neither signal provides specific information on chemical element content or material properties so the user has to guess whether a region is likely to be worth acquiring additional data from to provide such information. The derived X-ray images can provide information on chemical element content but have poor S/N and do not provide any detail of topography or a high enough resolution image to help the user know where they are on the specimen. What is therefore needed is an effective method for the user to visualise material properties such as chemical elemental content while navigating over large areas on a specimen to find materials of interest.

WO 2019/016559 A1 discloses a method for analysis that involves displaying in combination microscope images of a specimen acquired using two different types of detector and thus having different image acquisition properties and representing different information about a specimen, in real-time as the images are acquired. This technique enhances the speed and efficiency with which a user of the microscope equipment can navigate through different regions of the specimen and locate features of interest thereupon. This benefit arises not least because displaying the two types of image showing the same region of the specimen in the same field of view at the same time can allow a user to rapidly identify potential features of interest based upon images of the first type, which may show the physical shape or topography of the specimen surface, for example, while navigating around the specimen, and upon locating such potential features, maintain the field of view of the microscope so that it continues to include these features, so as to acquire or accumulate image data of the second type, so as to obtain information about that region of the specimen of a different type to the information provided by the first image type.

However, there remains a need for an improved method for analysis whereby the speed and efficiency with which material properties can be visualised while navigating over large specimen areas, as well as the quality of visual data than can be obtained for regions of interest, are enhanced further still.

SUMMARY OF THE INVENTION

In accordance with a first aspect of the invention there is provided a method for analyzing a specimen in a microscope, the method comprising:

acquiring a series of compound image frames using a first detector and a second detector, different from the first detector, wherein acquiring a compound image frame comprises:

a) causing a charged particle beam to traverse a region of a specimen, the region corresponding to a configured field of view of the microscope, wherein: when a mode parameter has a first value, the traversal of the beam is along a first traversal path on the region and is according to a first set of traversal conditions, and when the mode parameter has a second value, the traversal of the beam is along a second traversal path on the region and is according to a second set of traversal conditions, wherein a first total time required for the beam to traverse the entire first traversal path according to a first set of traversal conditions is less than a second total time required for the beam to traverse the entire second traversal path according to the second set of traversal conditions;

b) monitoring a first set of resulting particles generated within the specimen at a first plurality of locations within the region using the first detector so as to obtain a first image frame, the first image frame comprising a plurality of pixels corresponding to, and having values derived from the monitored particles generated at, the first plurality of locations, c) monitoring a second set of resulting particles generated within the specimen at a second plurality of locations within the region using the second detector, so as to obtain a second image frame, the second image frame comprising a plurality of pixels corresponding to, and having respective sets of values derived from the monitored particles generated at, the second plurality of locations, and d) combining the first image frame and the second image frame so as to produce the compound image frame, such that the compound image frame provides data derived from particles generated at the first and second pluralities of locations within the region and monitored by each of the first detector and the second detector;

and displaying the series of compound image frames in real-time on a visual display, wherein the visual display is updated to show each compound image frame in sequence.

The method provides further advantages, with respect to existing electron microscopy analysis techniques, when navigating and collecting data from a specimen. The inventors have devised an approach that provides additional benefits in terms of signal-to-noise and efficient and rapid specimen navigation. This is achieved by way of altering a mode in which a specimen is scanned by a beam when acquiring data for an image frame based upon whether the field of view of the microscope is changing or static. In particular, the method provides advantageous switching between a faster mode of image frame acquisition when the field of view is changing and a slower mode when the field of view is unchanging. A change in the time that is required to acquire data for a compound image frame, or the time that would be required to acquire the data for the entire frame or from the entire traversal path for the given mode, or a change in the acquisition speed, may be effected in a number of ways. These include altering the resolution of acquired images, altering the average time taken to acquire data from locations on the specimen surface, and altering the extent to which a traversal path covers a region on the specimen. Enabling this manner of switching provides a significant advantage during analysis of a specimen, wherein an operator might typically navigate the specimen in the microscope by moving the field of view relative to the specimen until a potential feature or region of interest is identified and then stopping the movement while further data is collected from that region or feature. By adjusting the manner in which the beam traverses the specimen surface and resulting particles are monitored, in response to how the microscope is being used to navigate the specimen, the speed and efficiency with which material properties can be visualised while navigating over large specimen areas, as well as the quality of visual data than can be obtained for regions of interest, are enhanced with respect to existing approaches.

The method facilitates real-time tracking of a specimen under a microscope by way of displaying combined images in real time. The sequential and rapid presentation of the series of acquired compound image frames provides an operator with a “live” view of a specimen being analysed by the two detectors. In the context of this disclosure, a series may be understood as a plurality of compound image frames occurring one after the other. The series may be thought of as having an order. Typically, this is the order, or corresponds to the order, in which the compound image frames were acquired, and/or the order in which their respective component frames, that is the first image frames and the second image frames, were obtained. Typically, the order of the series of compound image frames is the same order in which they are displayed.

The series does not exclude this set of compound image frames being a subset of a larger set or series of frames. Neither does the series necessarily exclude the possibility of overlap, in time and/or with respect to compound image frames in each set or series, with a further set or series of acquired frames. As is discussed later in this disclosure, it is possible that the series may be interrupted, for example by further frames that are not considered part of the series. For instance, intervening compound image frames might be acquired in the same, or different, manner, and such interactive compound image frames would not be considered part of the series. Preferably, however, the series is an uninterrupted series.

In this disclosure, the feature that acquiring a compound image frame comprises the above recited steps may be understood as meaning that acquiring each compound image frame in the series comprises these steps, in typical embodiments.

The mode parameter may be referred to as a scan mode parameter. This nomenclature is appropriate since the mode parameter value influences the manner in which the traversal of the region by the beam, which may also be called scanning by the beam, is carried out.

Generally in this disclosure, a parameter having a value may be understood as the parameter having a value equal to that particular value, which is generally a predetermined value.

It will be understood that the first value and the second value are typically different. Generally, the first value of the mode parameter corresponds to a first scanning mode, which is typically a “fast” scanning mode.

Generally, the second value that the mode property may have corresponds to a second scanning mode, different from the first scanning mode, and this is typically a “slow” scanning mode.

One way in which a particular mode parameter value can affect the scanning mode is by altering the transversal path of the beam for the acquisition of a compound image frame. Preferably, either or both of the first and second traversal paths are predetermined at least at or prior to the start of the traversal of a given frame. However, if the first and second traversal paths are different, it may be the case that either or both of those first and second paths could themselves be altered by one or more switches in the mode parameter value, that is changes to and/or from the first and second values, during the region being reversed for a given frame.

It will be understood, for example, that a switch between two pre-configured or predetermined preliminary paths might necessitate time-consuming or otherwise inefficient redirection of the beam. In such cases, some deviation from, and/or omission of, and/or alteration of either or both pre-configured or predetermined parts, so as to define the actual first and/or second paths that are traversed, may be permitted or effected.

The first plurality of locations and the second plurality of locations within the region are typically coincident with, or lie along, the first and second traversal paths respectively. One or more, or in some cases all, of the locations comprised by either or both of the first and second pluralities may be coincident with both of the first and second traversal paths for a given compound image frame.

In some embodiments, the value of the mode parameter is configured according to whether the configured field of view is changing or unchanging. Preferably the mode parameter is configured to have the first value or the second value according to whether the configured field of view is changing or unchanging respectively.

It may be particularly advantageous to have the fast scanning mode be initiated or otherwise caused to occur by the configured field of view being in a state of change. In some preferred embodiments, therefore, the mode parameter is configured to have the first value in response to the configured microscope field of view changing. The parameter being configured to have the first value may be understood as the parameter being set to the first value, regardless of the value of the parameter, and indeed whether the parameter had a value, prior to that setting. In such embodiments the fast scanning mode may be automatically engaged by changing the configured field of view.

Typically, the mode parameter has the first value while the configured microscope field of view is changing, that is while it has a changing state.

The said response is preferably immediate. However, in practice, some delay in the responsive setting of the parameter value may be necessary or desired, and so the response may be subsequent, for example by a possibly predetermined time or number of frames, to the configured field of view being put into the changing state. Preferably, the mode parameter is maintained at the first value as long as, or at least as long as, the configured field of view remains changing, or until it ceases changing. For example, in embodiments where in the parameter is automatically set to the second value by the configured field of view becoming or being static, switches of the parameter both to the first value and to the second value may be automatically made depending upon the configured field of view.

The mode parameter may be caused to have the first value in response to the configured field of view being in a changing state, for example, for a predetermined time, or for a predetermined number of frames in the series.

Preferably, the parameter may be configured to have the first value if changes to the configured microscope field of view are greater than a certain threshold, for example in accordance with a measure of configured field of view similarity with preceding frame fields of view and these may for example include degrees of overlap on the region between those configured fields of view, and/or relative or absolute configured locations on the specimen, and/or zoom levels.

The field of view with which the microscope is configured being "changing" may be understood to mean that it is in a state of change, or in other words that it is being configured to be changing in some way. For example, the configured change may comprise panning across the specimen and/or zooming in or out to correspond to smaller or larger regions on the specimen respectively. It will be understood also that the parameter being set to the first value may be responsive to the configured field of view either being in a changing state, or put into a changing state, or both. For instance, the first value may be set in accordance with or in response to a single configured field of view movement.

As alluded to above, in some embodiments the mode parameter is configured to have the second value in response to the configured microscope field of view being unchanging. This response likewise need not be immediate, necessarily, but may be delayed as with the setting to the first value described above. The field of view with which the microscope is configured may be understood that the field of view is configured to be static, or an altered, at a given time. In practice, as is discussed in more detail later in this disclosure, some changes to the actual microscope field of view may occur regardless of whether the configured field of view is changing. Thus it is possible that the actual field of view and the configured field of view are different, for example due to the field of view drifting.

The said response may be a response to any changes to the configured field of view ceasing as noted above. The second value may be set in response to the configured field of view being in an unchanging state for, for example, a predetermined time or for a number of frames in the series.

Setting the mode parameter value in response to a changing or unchanging state of the configured field of view may permit changes between scan modes during the acquiring of a given compound image frame. That is to say, the mode parameter may, during the acquiring of a given compound image frame in the series, have the same value, or may be changed between different values, in accordance with changes to the state of the configured field of view, namely whether it is static or non-static.

In some embodiments, however, the state of the field of view with which the microscope is configured being either changing or unchanging may correspond to two successive compound image frames, or component image frames thereof, in the series having different or identical configured fields of view respectively. Typically, the compound image frame currently being acquired at a given time is the second, that is later, one of these two successive frames. Making the changing/unchanging determination in this way may be useful in implementations where mid-frame acquisition mode changes are not anticipated or desired.

In some embodiments, therefore, during the acquiring of a compound image frame in particular, the mode parameter has the first value when the configured microscope field of view is different from that for an immediately preceding compound image frame in the series. It will be understood that the parameter value may be adjusted to be that value, for example based upon a condition relating to the configured field of view being met, or may be caused to remain with the appropriate value while the respective condition continues to be met.

In the context of this disclosure, the term "preceding" may be understood as occurring before in time, that is referring to a compound frame acquired before a current compound frame. The term "immediately" in this context may be taken to mean that there are no intervening frames between the current compound imagery being acquired and the immediately preceding compound image frame in the series. It would be understood that this does not preclude acquiring one or more of the compound image frames, or any other frames, images, signals, or other data, in between the current compound image frame and be immediately preceding one in the series. Any such other compound image frames or data may be captured if they are not part of the second series of compound image frames in particular. That is to say, although the series of compound image frames is preferably an uninterrupted series, as explained earlier in this disclosure, and this may signify that no further frames are acquired currently with or between the acquiring of the compound image frames in the series, it may be necessary in some embodiments to interrupt the specified function performed in acquiring successive image frames. The series may be an interrupted series in this manner, for example if there is a delay of one or more frames before effecting a change in scanning mode.

The above described functionality may relate to the first scanning mode being used when a difference between successive fields of view occurs. Conversely, in some embodiments, the mode parameter has the second value when the configured microscope field of view is the same as that for an immediately preceding compound image frame in the series. As above, this may mean that the parameter value can be adjusted to be that value, for example based upon a condition relating to the configured field of view being met, or it may be caused to remain with the appropriate value while the respective condition continues to be met. In the context of such embodiments, the immediately preceding compound image frame is generally the same as the immediately preceding compound image frame referred to in relation to the mode parameter being caused to have the first value. In some implementations an automatic switch to a slow mode may be made based upon a determination that successive compound image frames have the same configured field of view.

In addition to automatic scanning mode switches, it is also possible that the scanning mode may be controlled by a user. Accordingly, in some embodiments, the mode parameter is user configurable. In other words, the mode parameter may have a value that can be configured by user. It is particularly advantageous in some cases for a user of the microscope to be able to set the scan mode to the slow mode. That is, the ability for a user to initiate slow scanning manually may be of particular benefit when analysing a sample and using the live monitoring techniques described. Accordingly, in some preferred environments, when a first user input is provided, the mode parameter is set to the second value. The first user input may be a manner of input, for example one made by a computer-user interface. The input may comprise a command, key, or toggle for setting the mode parameter to the third value and thereby causing the slow scanning. In some embodiments, the user input can be used to set the parameter either or both of the first and second values. The capacity to switch the parameter to the second value at least is preferably configurable. This may facilitate greater control over the live monitoring and navigation of the specimen.

Providing the ability for a user to initiate slow scanning in this way is particularly advantageous when implemented in combination with a configuration that the mode parameter to have the first value when the configured microscope field of view is different from that for an immediately preceding compound image frame in the series, or when the configured field of view is otherwise in a changing state. In this way a user may set the scanning to a slower mode in order to improve image data, on demand while navigating.

The user will typically halt movement of the configured field of view when doing so. Accordingly, it is advantageous for the scan to subsequently switch to the fast mode upon field of view movement being commenced once again.

In addition to implementing an alterable scanning mode in order to facilitate switches between fast scanning and high-quality scanning as necessary during specimen navigation, the manner in which the required frame data is processed can also be adjusted according to a similar principle. That is, in some embodiments, acquiring a compound image frame further comprises: for each of at least a subset, preferably all, of the plurality of pixels comprised by the second image frame: if a second mode parameter has a second value: combining the set of derived values of the pixel with a set of derived values of a corresponding pixel of each of one or more preceding second image frames in the series, so as to obtain a set of combined pixel values having an increased signal-to-noise ratio, and replacing the set of derived pixel values for the second image frame with the set of combined pixel values for use in the compound image frame; or if the second mode parameter has a first value: maintaining the set of derived values of the pixel in the second image frame for use in the compound image frame.

Preferably the plurality of pixels is the same as the set of pixels that make up the frame. However, they may be a subset thereof. The second mode parameter may be referred to as a frame processing mode parameter. The "corresponding pixel" referred to above typically means pixels in different frames that correspond to, that is have values derived from particles emitted from, the same location on the specimen.

The second mode parameter may therefore control whether the second image frame data is processed in a "refresh" or an "accumulate" mode, as discussed in greater detail below. In some embodiments, the second mode parameter has the first value if the configured microscope field of view is different from that for an immediately preceding compound image frame in the series. Although this "accumulate" and "refresh" mode functionality is preferably applied to the second image frame, in various embodiments it may additionally or alternatively be applied analogously to the first image frame.

As with the first mode parameter described earlier in the disclosure, which may be used to control the traversal or scanning by the beam, the second mode parameter, which may control the mode of processing acquired second image frames, can be configured to be adjusted in accordance with a number of factors. In particular, both manual control and automatic switching are envisaged.

Therefore, in some environments, automatic switching to the second mode, that is accumulation mode, of frame processing may be affected in accordance with a similarity, or identity, between successive configured microscope fields of view in the series. In particular, the second mode parameter may have the second value when the configured microscope field of view is the same as that for an immediately preceding compound image frame in the series.

Additionally, or alternatively, to the said automatic parameter setting to control the frame processing, the second mode parameter may be user-configurable. In particular, in some embodiments a user input can be used to set the parameter to either or both of the first and second values, providing the capacity to switch to the second value, at least, being preferable. This may facilitate the rapid obtaining of high-quality data when an area of interest comes into a field of view during the live monitoring and navigation of the specimen, by way of providing the user with the ability to cause acquired second image frames to be combined in order to improve the signal-to-noise ratio of the data therein. As above, the mode parameter being set to a value may be understood as the mode parameter been configured to have that value. Thus, in some embodiments, the second mode parameter is set to the second value in response to a user input. This, as with the user-selectable scanning mode, is particularly advantageous in embodiments in which a switch to a "refresh" frame processing mode is effected automatically based upon the state of the field of view with which the microscope is configured. In this way, the user can set the frame processing functionality to accumulate in order to improve the data upon specimen navigation being halted. Accordingly, it is advantageous for the frame processing to switch to the "refresh" mode in order to enable rapidly updating data to be presented upon movement of the field of view beginning again.

The nature of the user input is typically the same as that described above in relation to the scanning mode.

Some embodiments involve compensating for unintentional drifting of the actual field of view of the microscope that may occur. Such a deviation between an actual field of view and an intended or configured field of view can, in absence of such correction, render it difficult or impossible to combine meaningfully values of pixels of different image frames in the series. This is because this unintentional movement or displacement of the actual field of view typically causes pixel data that represents signals from the same location on the specimen being attributed to pixels with different positions in two respective image frames.

It has been noted in this disclosure that in some cases the actual field of view of the microscope might not always be the same as the configured field of view. This may be, for example, due to thermal effects on sample stage mechanics or beam deflection electronics. The acquiring of a compound image frame may further comprise: obtaining field of view deviation data representative of a difference between an actual field of view of the microscope and a reference field of view; and for each of at least a subset of the plurality of pixels comprised by the second image frame, determining the corresponding pixel of each of one or more preceding second image frames in the series, with which the set of derived values of the pixel is combined to obtain a set of combined pixel values, in accordance with the field of view deviation data. It is particularly advantageous to apply this functionality when a frame is acquired using the "accumulate" mode of processing. Accordingly, the acquiring of a compound image frame preferably further comprises those steps if, that is on the condition that, the second mode parameter has the second value. Preferably the correction is performed only on that condition. However, applying drift correction when that condition is not met is not excluded.

The said "difference" may be a difference in linear and/or area coverage of, and/or position on the specimen, between the fields of view. It may comprise a difference between a configured field of view and an actual field of view of the microscope, typically at a given time, and preferably at a time during the acquiring of a compound image frame, in particular a second image frame. The field of view deviation data may be a measure of the difference, or a calculated, inferred, or predicted indication, value or estimate of the difference. For instance, it may be expressed in terms of a vector representation, or a drift vector. The data may be indicative of a difference between the actual field of view and the configured field of view, or may indicate the drift by a relative measure, for example with respect to other frames in the series. The field of view deviation data may be obtained in accordance with a plurality of obtained first image frames. It may indicate, or be a measure or representation of, field of view drift. In some embodiments it may be determined by cross-correlation of successive first image frames, which are in some embodiments electron images.

The correction used in combining pixels in some embodiments is applied typically for at least a subset of, but preferably all of, the pixels in a second image frame and may also be applied to pixels of the first image frame if first image frame data is to be combined in "accumulate" mode of processing. For example, the subset for a given frame may be those for which a corresponding pixel may be found. As noted earlier in this disclosure, two pixels in different image frames being corresponding pixels may be thought of those pixels corresponding to the same position on the specimen. For some pixels, however, a corresponding pixel might not be found or may not be identifiable, such as in the case of peripheral pixels corresponding to a part of the specimen that have unintentionally drifted into the actual field of view. It will be understood that, in embodiments involving substantially simultaneous acquisition of first and second image frames, unintentional movement of the specimen with respect to the beam will typically affect both first and second image frames. Preferably, registration is maintained between first and second image frames in acquiring a compound image frame. This may be achieved, for example, by drift-correcting both first and second image frame data, or drift-correcting only the second image frame data, for instance using the first image frame data for reference and/or measurement of deviation, and this can also include using the first image reference data for generating the compound image. Accordingly, the above-described steps for drift-correcting the image frame data when acquiring a compound image frame may be applied to either or both of the first and second image frames.

Generally, drift correction may be employed so as to identify field of view drift or deviation between frames, thereby allowing pixels in different second image frames, or compound image frames, that correspond to the same location on the sample to be identified, and their value sets combined. Preferably, therefore, the obtaining of the set of combined pixel values is performed such that the corresponding pixel corresponds to, or is representative of, monitored particles emitted from, the same location of the specimen as the current pixel.

Although the configured field of view and the actual field of view are preferably the same, any unintended drift in position of the actual field of view can reduce the quality of combined second image frame data, by disrupting the correspondence between pixels in different frames. This unintended drift is therefore preferably corrected between successive image frames in order to ensure that pixel values are only combined where data arises from the same position on the specimen. Accordingly, in some embodiments the reference field of view comprises any of a configured field of view for the compound image frame being acquired and an actual field of view for a preceding compound image frame in the series. The said actual field of view is preferably that of the microscope during the acquiring of the compound image frame. Generally, in embodiments involving drift correction, when the second mode parameter has the second value, once the system starts to integrate frames, preferably regardless of any delay before commencing the integration, data from the first compound image frame during a period of operating in "integrate" mode, and typically a first image frame thereof, may be used as the drift-correction reference so that data from all subsequent frames are combined with the positions corrected for drift. Thus the reference field of view may comprise the actual or configured field of view of a preceding compound image frame, typically one acquired upon of subsequent to the second mode parameter being set to the second value.

In addition to, or as an alternative to, using the deviation data to establish correspondence between acquired frames where the field of view has drifted, that data may be used to mitigate the drift itself. Thus in some embodiments the acquiring of a compound image frame further comprises, in particular if the second mode parameter has the second value: adjusting the actual field of view in accordance with the field of view deviation data so as to reduce the difference between the actual field of view of the microscope and the reference field of view. In other words, an adjustment may be made to the acquisition conditions for subsequent frames, such as the beam deflection or possibly stage position and/or movement, so as to cause the actual field of view to match, or at least match more closely, the reference field of view.

In some embodiments, particularly those wherein particles monitored by the second detector can be used to derive data indicative of chemical elements present in the monitored specimen locations, processing is preferably performed in order to obtain characteristic line emissions. This is most preferably performed even for overlapping characteristic line distributions and the processing preferably excludes any bremsstrahlung contribution. In some embodiments, acquiring a compound image frame for the comprises processing spectrum data, preferably X-ray spectrum data, obtained in accordance with the second set of particles so as to obtain data indicating a quantity, that may be understood as a number, such as a count, of particles in the second set of particles that correspond respectively to one or more characteristic line emissions, in order to derive the respective sets of values of the pixels comprised by the second image frame.

In the context of X-ray data, it will be understood that be said second set of particles comprise photons, namely X-ray photons. The processing of spectrum data may comprise processing one or more signals output by the second detector. The characteristic line emissions may refer to a set of X-ray transition lines corresponding to different transitions between states for a given chemical element, as is well understood in the art.

The respective sets of values derived from the second set of monitored particles may be derived by processing X-ray spectrum data to extract the number of photons corresponding to particular characteristic line emissions even when the line emissions from two different elements are spread over a range of energies and overlap in terms of energy. Thus the processing preferably comprises extracting the data indicating a quantity of particles within one or more characteristic line emissions are spread over a range of energies and/or correspond to overlapping energy ranges.

Preferably in such embodiments one or more of the sets of values each comprises X-ray energy spectrum data representable as a histogram wherein the area of each rectangle represents a number of second particles having energies within a range of energy is corresponding to the width of the rectangle. It will be understood that a "rectangle" in this context need not be represented as such, but typically comprises data, such as a pair of values that may respectively be visualised as a rectangle height and width, suitable for being plotted as a rectangle on a histogram. The one or more of the sets of values may each comprise a set of results of processing a histogram. The area of each rectangle, that is the product of the two values in a pair, may represent a number of second particles having energies within a range of energy is corresponding to the width of the rectangle, so as to extract a set of values representing the number of second particles collected from characteristic emissions of a set of chemical elements.

A traversal path may be thought of as a path over or along which the beam is scanned in order to obtain a frame covering the region.

The quicker total time to traverse the region with the beam in the first, "fast" traversal mode may be effected in a number of ways, individually or in combination. For instance, the total length of the traversal path of it in the first mode may be shorter than that for the second mode, so as to enable its traversal by the beam more quickly. In some embodiments, therefore, the first traversal path has a length that is shorter than that of the second traverse or path, such that the first total time is less than the second total time.

In other embodiments, the first and second traversal paths may be of equal length, with the traversal time difference being attributable to the first and second traversal conditions being different. Accordingly, in some embodiments the first and second sets of traversal conditions are configured such that the beam is caused to traverse the first traversal path, in particular according to the first set of traversal conditions, at an average rate that is faster than that at which the beam is caused to traverse the second traversal path, in particular under the second set of traversal conditions, such that the first total time is less than the second total time. The average rate is typically a mean rate. The rate may be taken to relate to the average rate of traversing an entire traversal path, therefore. A given traversal path may in this way be traversed faster under the first set of conditions then under the second.

In other words, the first and second conditions may be different, while the first and second parts are the same, or, the first and second paths may be different while the first and second sets of conditions are the same, or both the first and second paths and the first and second conditions sets may be different. Advantageously, the first and second paths and conditions together, in any of these combinations, may cause the total traversal time to be shorter for the first path and conditions than for the second path and conditions.

Typically in such embodiments, the first and second set of traversal conditions are configured such that a first linear density along the first traversal path, of locations within the region for which the first set of generated particles are configured to be monitored is less than a second linear density, and on the second traversal path, of locations within the region for which the first set of generated particles are configured to be monitored. Typically, this configuration is applied such that the average rate for traversing the first traverse or path under the first set of conditions is faster than the average rate for the second half and the second conditions set.

The linear density as referred to above may be understood as referring to respective average linear densities for the entire length of a given traverse or path, or at least a portion of it.

Typically, the linear density of locations relates to a (possibly discontinuous) portion corresponding to one or more scan lines in a traversal path, which may exclude parts of the path between the scan lines, for example in a raster pattern.

Generally, a linear density may be taken to refer to a density of distribution, measure, or number of to-be-monitored locations per unit of length of a traversal path. In some embodiments this difference in linear density may also mean that the total number of locations to be monitored is less, according to the first set of conditions, than it is for the second set of conditions. This may be the case, for example, where the first and second path lengths are the same or similar.

Preferably in embodiments such as this, the first and second set of traversal conditions are configured such that a first linear density, along with the first traversal path, of locations within the region for which the second set of generated particles are configured to be monitored, is less than a second linear density, along the second traversal path, of locations within the region for which the second set of generated particles get to be monitored, in particular such that the average rate for traversing the first and traversal path under the first set of conditions is faster than the average rate for the second path and the second condition is set. The rate difference may thus be achieved by the linear density of either or both of the first and second locations being different.

A difference in scanning rate between the two modes may also be achieved by altering the time taken to monitor signals from the monitor locations during a scan. Both the first and second set of traversal conditions may be configured such that a first configured monitoring duration for which the first set of particles generated at each of the first plurality of locations along the first traverse or path is monitored is less than a second configured monitoring duration for which the first set of particles generated at each of the first plurality of locations along the second traverse or path is monitored. In some implementations, the monitoring duration for each and every location for which the particle set monitored is less when the mode parameter has the first value than a monitoring duration for any of the locations for which the particle set is monitored when the mode parameter has the second value.

For example, the monitoring duration for each, or at least some of, the monitored locations under a given conditions set may be the same or substantially so.

Preferably, the average, or mean, monitoring duration for monitored locations when the mode parameter has the first value is less than the average or mean monitoring duration when it is the second value.

Likewise a rate difference may be affected by either or both of the first and second particle sets. Therefore, in some embodiments, the first and second sets of traversal conditions are configured such that a first configured monitoring duration for which the second set of particles generated at each of the second plurality of locations along the first traversal path is monitored is less than a second configured monitoring duration for which the second set of particles generated at each of the second plurality of locations along the second traversal path is monitored.

In various embodiments, for a given compound image frame the first and second traversal paths may be the same or different. For example, the paths may be the same, and changing the rate at which the paths are traversed therefore can constitute changing the rate at which the region itself is traversed. Thus, in some embodiments, the beam is caused to traverse a first traversal path on the region at an average rate that is faster than an average rate at which the beam is caused to traverse a second traversal path on the region when the configured microscope field of view is the same as that for the immediately preceding compound image frame in the series.

However, in some embodiments, the traversal paths taken in the two modes may be different for a given compound image frame. For instance, if an interlaced scan is used to effect scanning at the second average rate, namely in the "slow" or "static" mode, and a non-interlaced scan is used for the first, "fast", "dynamic" mode, the time taken for a single complete scan of the region by the beam may be the same for both the first and second modes. In such cases, the time taken for the beam to traverse the entire second traversal path, which will comprise multiple scans that, in combination, preferably cover the region, remains greater than the time taken for the beam to traverse the first traversal path, which comprises only a single "pass" over the region, and may constitute a part of a traversal path that covers, or at least substantially covers the region.

In other words, the second traversal path may be longer than the first, for example by virtue of including a greater number of passes over the region. In these cases, the increase to the average traversal rate for the first mode compared with the second mode may be at least partly attributable to lengthening of the path in the second mode. In some embodiments, for example, the time required for a single pass over the region may be the same in both the first and second traversal modes or paths. However, in these cases, the requirement that, a greater number of passes are required to completely traverse the second path than the first path means that the total time required for the second path is greater, and hence the traversal rate may be considered to be slower.

Throughout this disclosure, for any described embodiment in which a change in traversal rate is defined in terms of the time taken to traverse the region, it is also envisaged that the embodiment may generally be performed by instead defining the change in traversal rate in terms of the time taken to traverse a traversal path. Likewise, a change in traversal rate for first and second acquisition modes may be equivalently defined as a change in the total time required to scan a respective first and second traversal paths, or in some embodiments a change in the total time required to scan the region. The traversal time is referred to as a "total" time for the reason that it comprises the whole time that would be taken to traverse the whole traversal path, in a given mode for example. As will be understood from the preceding descriptions and those throughout this disclosure, the acquiring of a frame in the series may involve some interruption of traversal in one mode by switching to traversing in another mode, and so the total time need not necessarily be the same as the actual time taken for the beam to traverse a part of the specimen in order to generate particles for acquiring the frame.

Similarly, for any embodiment in which a change in traversal rate is described, this change may be understood as a change in the configured total time required, or the total time that would be taken, for the beam to traverse the entire traversal path. In this way, the rate need not necessarily be defined as an average speed at which the beam is caused to pass across a given distance on the specimen surface during monitoring, although in some embodiments a change in the rate may additionally correspond to a change in such an average speed. Rather, the average traversal rate may be understood as a measure of the speed at which the traversal of the entire path occurs, which may also correspond to, or be derived from a measure of the time required to scan the entire traversal path.

During the acquiring of a compound image frame, therefore, for some embodiments step (a) may alternatively be understood as comprising: causing a charged particle beam to traverse a region of a specimen, the region corresponding to a configured field of view of the microscope, wherein, when the configured microscope field of view is different from that for an immediately preceding compound image frame in the series, the beam is caused to traverse a first traversal path on the region at an average rate that is faster than an average rate at which the beam is caused to traverse a second traversal path on the region when the configured microscope field of view is the same as that for the immediately preceding compound image frame in the series.

The charged particle being caused to traverse the region may be understood as the beam, which is typically an electron beam, being caused to scan the region. That is to say, in the context of this disclosure, the term "scan" may be understood as causing a surface, object, or part of a specimen, to be traversed by a beam.

During the traversing of the region by the beam, as well as during processing of pixels of the second image frame, and furthermore, typically, during the monitoring of the first and second sets of generated particles, the functionality depends upon whether the configured microscope field of view is different from, or the same as, the field of view for an immediately preceding compound image frame in the series. It would be understood that the functionality applied in any or all of these parts of the compound image frame acquisition procedure when the configured microscope field of view for a compound image frame currently being acquired is different from that of the immediately preceding compound image frame in the series is typically also applied when no such immediately preceding compound image frame exists. That is, for the first frame in a series, the method typically performs part or all of the compound image frame acquiring procedure as though the configured microscope field of view for the current frame were different from that for an immediately preceding compound image frame in the series.

The particular manner of frame acquisition is typically based on a determination as to whether the fields of view for the current and immediately preceding frame are different. This determination may be made based upon, for example, the field of view of the microscope at the time when the procedure for acquiring a given compound image frame is started. In some embodiments, the determination may be based upon the field of view at the time at which particles are generated at or monitored from the first and/or pluralities or locations, or a time at which the beam first impinges on the first location, for respective current and immediately preceding frames in the series. In some embodiments, a determination may be made or assessed once, multiple times, or continuously throughout part or all of the acquisition of a compound image frame. This can advantageously allow the mode to be altered prior to a current frame being completely acquired, as will be described in more detail below.

The beam being caused to traverse the region in the reduced total time may be understood as the scanning rate being altered, specifically in this case to be greater, in dependence on whether the field of view is the same. It will be understood that the reduced total time refers to the total traversal time, for the first traversal path, that is less than the total traversal time in which the beam is caused to traverse the second traversal path. In some embodiments the reduced traversal time is achieved at least in part by causing the beam to traverse the first traversal path at a faster average rate than an average rate at which the beam is caused to traverse the second traversal path. However, it is additionally and alternatively possible to effect the difference in traversal time at least partly by using a different traversal path, such as a first traversal path that has a shorter total length than that of the second traversal path.

It will be understood that the field of view changing, or being different, may involve either or both of the field of view moving across, or with respect to, the specimen surface and the size of the field of view being increased or decreased. This increase or decrease may be understood as a change in magnification level, for example.

The traversal of the region by the beam may typically comprise any one or more of: a "raster" scan pattern, an "interlaced raster", and a "serpentine" scan pattern, such as that depicted in FIG. 1, as well as many other types of scan paths along which the focused beam can traverse the field of view. The aforementioned conditional application of a different average traversal rate based upon the configured field of view having changed may conversely be understood as, when the configured microscope field of view is the same as that for the immediately preceding image compound frame in the series, the beam being caused to traverse the region at an average rate that is slower than the average rate at which the beam is caused to traverse the region when the configured microscope field of view is different from that for the immediately preceding compound image frame in the series. An average rate at which the beam is caused to traverse the region may, in the context of this disclosure, be understood or defined in terms of a configured or intended total time that is taken, or would be taken if that mode were applied for the acquisition of the entire frame, to traverse the region at the given rate. In some embodiments, the speed at which the intersection between the beam and the specimen surface moves across the surface is not constant. For example, the scanning process may involve moving between, and dwelling upon so as to monitor particles from, discrete locations on the surface. A "fast" and "slow" traversal mode, or scan mode, may respectively correspond to comparatively shorter and longer pixel dwell times. These dwell time differences may be effected, for each mode, for one, a plurality, or each of the locations monitored, and correspondingly pixel values obtained, while operating under a given mode. A scan mode in which more time is spent collecting a signal from traversed locations on the specimen, and accordingly collects more data relating to those locations, beneficially provides a greater signal-to-noise ratio.

More generally, the traversal speed may be configured to change throughout the scanning process when operating in a given mode or at a given rate. In a raster scanning process, for example, the beam preferably moves more rapidly between the end of one line and to the beginning of the next than when traversing a line in the pattern.

The "fast" and "slow" average traversal rates are typically configured such that, while accounting for mid-scan speed changes such as these, the total time that would be required to traverse the entire region at the faster rate, corresponding to a first mode in some embodiments, is less than the total time that would be required to traverse the entire region at the slower rate, when operating in a second mode in some embodiments. Additionally, it would be understood that the traversal pattern for the first and second modes may be the same or may be different, and that in the latter case, this scanning pattern difference may contribute to the difference in the average traversal rate.

The faster and slower traversal rates that are applied conditionally, depending on if the field of view is changed or unchanged, respectively, may accordingly be defined in terms of a first traversal duration, $T_1$ and a second traversal duration $T_2$, wherein $T_1$ is less than $T_2$. Typically, however, those configured total times need not necessarily be the same for any two compound image frames in the series. Rather, these times are preferably defined individually, for a given frame, such that for that frame the aforementioned inequality is applied, while each of $T_1$ and $T_2$ may be the same or different for any two given frames in the series.

The traversal rate is typically set at the time of starting to acquire a compound image frame. The rate might not be expressly set during each frame being acquired, and may, for example, have a value, parameter, or configured rate that is retained or signalled, having been set previously, stored, or maintained, from when a preceding compound image frame was acquired. Furthermore, the rate may also be adjusted during the acquiring of a given compound image frame, as will be discussed in greater detail below.

The number of locations from which the first and second sets of particles are monitored may remain constant or differ for two given compound image frames in the series. In this way, the first and second pluralities may each be different in number for each compound image frame acquisition procedure.

The sets of values derived from the monitored particles generated at the second plurality of locations may be sets of one or more values. Preferably, however, the said sets comprise one or more values derived from those monitored particles. In preferred embodiments, pixels in the second image frame may comprise respective sets of multiple values that represent a particle spectrum emitted from the second plurality of locations.

Typically, the second detector is an X-ray detector. Accordingly, the second set of particles are X-ray photons, and the set of values for the pixels in the second image frame are representative of an X-ray spectrum. The set of derived values that is maintained, conditionally, in step (d) in some embodiments, may be understood as the set of values derived from the monitored particles at step (c).

In order to increase the collection solid angle for X-rays, an arrangement may be used in which the X-ray detector is disposed at a position between a beam source and the specimen. The X-ray detector may be provided with one or more sensor portions facing the specimen and at least partly surrounding the incident charged particle beam. In particular, in preferred embodiments, the X-ray detector is mounted below a pole piece of a particle beam lens of the microscope, such as an electron lens. In this context, the term "below" may be taken to mean, with respect to positions along an axis that is parallel to the beam, or with respect to such an axis, closer to the specimen than the pole piece. Preferably the X-ray detector is mounted immediately below the pole piece. In this way, the solid angle over which X-rays are received by the second detected can be increased so as to improve the signal-to-noise ratio of the X-ray signals. A sub-polepiece detector that is proximal to the specimen and/or surrounds the beam at least partly, facilitates this increase in collection solid angle. Preferably, therefore, the X-ray detector has one or more sensor portions facing the specimen and at least partly surrounding the beam. The sensor portions typically comprise corresponding sensor surface portions, and these preferably face the specimen in the sense that they are positioned and/or oriented with those surface portions towards the specimen. The portions at least partly surrounding the beam may be understood as those portions being distributed around the beam. Thus the sensor portion or portions may be present on all sides of the beam, and may be continuous, such as an annulus, or discontinuous. For example the detector may be arranged in the form of multiple discrete sensor surfaces positioned at intervals around the beam. A sensor surface may be understood as an active surface, that is adapted to receive, and cause a signal output in response to, incident particles.

It will be understood, however, that the sensor portions need not necessarily surround the beam in order to achieve an improved solid angle for signal collection. Other arrangements are envisaged in which the size of the sensor services, in combination with their intended working distance, that is separation between a plane in which one or more sensor portions lies and the specimen surface, particularly at the point of impingement of the beam, achieve an increased solid angle.

The size and/or shape of the total X-ray detector surface, whether it comprises one or a plurality of sensor portions, are preferably configured such that the total solid angle subtended by the one or more X-ray sensor portions at the location at which the beam strikes the specimen is greater than 0.3 steradians when the working distance, namely a separation between the sensor plane and the beam spot, or a minimum or mean separation between any part of the X-ray sensor surface and the beam spot, is less than or equal to 6 mm. More preferably the solid angle is greater than 0.4 steradians, in that range of working distances. Additionally or alternatively, in order to provide the improved X-ray signal, the X-ray sensor surface may have a total area greater than 10 $mm^2$, preferably greater than 20 $mm^2$, more preferably still greater than 30 $mm^2$, 40 $mm^2$, or 50 $mm^2$.

The conditionally applied "combining" functionality, at step (d) in some embodiments may, as stated above, involve values of a corresponding pixel of each of one or more preceding second image frames in the series for which the microscope field of view is the same as the current configured field of view. Whether a set of values of a corresponding pixel of one preceding second image frame, or multiple preceding second image frames is used is typically dependent on which, or how many, compound image frames have the same field of view as the current configured field of view. Preferably a derived set of values for all previously acquired compound image frames having the same field of view as the current compound image frame are used in that combination process. In some embodiments these combinations may be cumulatively applied, as each compound image frame is acquired for example. The preceding second image frame in the series for which the microscope field of view being the same as the configured microscope field of view, referred to at step (d) of the frame acquisition process may be understood as one or more second image frames that have been obtained as part of acquiring one or more respective compound image frames preceding the current compound image frame. The configured microscope field of view that is also referred to at that step may be understood as the current microscope field of view. In various embodiments, the current configured microscope field of view may be defined as the field of view configured at the start, or some predetermined point, during the acquisition of the current compound image frame. In some embodiments, it may be defined as an instantaneous configured field of view, for example at a given time during the compound image frame acquisition. Accordingly, in such embodiments, this instantaneous field of view may change throughout the acquisition of a compound image frame, and so it is possible, in some embodiments, to alter the acquisition mode, or the configured traversal rate, in response to a change in the field of view that occurs during the acquisition of a given compound image frame.

During a given compound image frame acquisition cycle, the functionality of step (d) is preferably performed for each pixel of the second image frame. In this way, all pixels of the frame acquired at step (c) are subjected to the conditional "combining" or "refreshing" process, thereby maximising the enhancement to S/N and specimen navigation. However, it is possible, in some embodiments, for one or more of the pixels of a given second image frame to be omitted from this processing step. Thus, in general, the functionality of step (d) is performed for each of the said plurality of pixels comprised by the second image frame, rather than necessarily being performed for every pixel comprised by the second image frame. In other words, the second image frame may, in some embodiments, or for one or more frames in the series, comprise further pixels, in addition to the said plurality of pixels. This applies analogously to embodiments wherein conditional pixel value combination is applied additionally to the first image frame, and in those involving the per-pixel setting of the acquisition mode parameter, which are described later in this disclosure.

Typically, combining the first image frame and the second image frame so as to produce the compound image frame comprises the first image frame being combined with the second image frame having pixels with value sets that are either those retained value sets derived during the acquiring of the current compound image frame, or those combined value sets that replace them, if the field of view is, respectively, different from or the same as, that of the immediately preceding compound image frame.

During the acquiring of a compound image frame, steps (b) and (c) are typically performed substantially simultaneously. This may be understood as the overall process of monitoring the first set of particles and that of monitoring the second set of particles, for the entire region, occurring concurrently, or substantially so. This substantial simultaneity is such that the first image frame and the second image frame provide first and second spatial representations of the region captured at substantially the same time. However, the monitoring duration and timing for individual locations of the first and second pluralities thereof may differ between the first and second detectors and particle sets, and between locations from which first and/or second particle sets are detected. For example, different and/or variable sampling rates and pixel resolutions may be used. Therefore, monitoring sets of particles generated at individual ones of the first and second pluralities of particles may or may not be simultaneous, even where the overall collection of signals by the first and second detectors is.

The method may be used in analyzing a specimen in any charged particle beam instrument, or an instrument that uses a focused particle beam. Accordingly, in this disclosure, the term microscope is used to refer to any such instrument. Typically, the microscope is an electron microscope, wherein the charged particle beam is an electron beam. In other embodiments, the charged particle beam is an ion beam.

Furthermore, the display of the combined first and second image types in the compound image frame in real-time as the series of compound images are acquired means that such actions can be performed seamlessly, “on the fly”, without pausing or interrupting the navigation of the specimen by the user.

It will be understood that the term “particles” as used in this disclosure includes particles of matter, including ions and subatomic particles such as electrons, as well as particles representing quanta of electromagnetic radiation, namely photons, for example, X-ray photons. In some embodiments, for instance, the charged particle beam is an ion beam, which typically causes resultant particles including electrons and ions to be emitted from a specimen, which can be monitored by the detectors.

The method is particularly beneficial in embodiments wherein the second detector is of a type that monitors signals typically having a lower signal-to-noise ratio than the signals that the first detector is adapted to monitor, under given microscope conditions. In such embodiments, the combination of first and second detectors may be chosen such that the first detector provides high signal-to-noise ratio image signals quickly, in order to allow a user to rapidly inspect different regions of a specimen. Typically, in navigating around the specimen by moving the field of view across different regions thereof, or otherwise adjusting the field of view, for example by magnification, the second, lower signal-to-noise ratio detector may provide poorer quality second image frames than the first image frames obtained by the higher signal-to-noise first detector. However, when the user stops changing the field of view, for instance by ceasing to adjust the stage position or microscope conditions, so as to maintain a fixed field of view, repeat measurements for the same pixels or locations on the specimen may be acquired by the detectors, and so, by combining pixel data from the second image frame with corresponding pixel data of previously acquired second image frames corresponding to the same locations in the specimen, the lower signal-to-noise ratio of images acquired using the second detector can be alleviated, and higher-quality images derived from data acquired by the second detector may be obtained.

As explained earlier in this disclosure, a faster scan rate being applied when the field of view is changing provides the advantage that an operator of the microscope is able to track features of interest more effectively while navigating the specimen, owing to the resultant faster frame rate with which compound image frames can be displayed. The signal-to-noise ratio, particularly for the second detector, is typically lower at faster scan rates. For this reason, in conventional techniques, the use of such higher rates would be unfeasible. However, the inventors have found, surprisingly, that when the field of view is changing rapidly, a greater benefit is felt in compromising the signal-to-noise ratio in favour of easier navigation. The method can realise this benefit while also permitting higher signal-to-noise ratios to be achieved for static fields of view, by way of switching between faster and slower scan rates.

In some embodiments, each image frame comprises a plurality of pixels corresponding to, and having values representing the monitored particles generated at, the plurality of locations within the region. For example, a pixel value may represent the intensity of particles monitored by a detector and generated at the corresponding location. Consequently, the compound image frame may, in some embodiments, provide data representing, for each of the plurality of pixels, the particles generated at the corresponding location within the region and monitored by each of the first detector and second detector. In other embodiments, such as those wherein an image frame is an electron backscatter diffraction image, the pixel values may not directly represent the generated particles at the locations, but may rather be derived therefrom, by way of calculation.

In accordance with a second aspect of the invention there is provided a method for analyzing a specimen in a microscope, the method comprising:

acquiring a series of compound image frames using a first detector and a second detector, different from the first detector, wherein acquiring a compound image frame comprises:

a) causing a charged particle beam to traverse a region of a specimen, the region corresponding to a configured field of view of the microscope, wherein, when the configured microscope field of view is different from that for an immediately preceding compound image frame in the series, the beam is caused to traverse a first traversal path on the region in a total time that is less than a total time in which the beam is caused to traverse a second traversal path on the region when the configured microscope field of view is the same as that for the immediately preceding compound image frame in the series, b) monitoring a first set of resulting particles generated within the specimen at a first plurality of locations within the region using the first detector so as to obtain a first image frame, the first image frame comprising a plurality of pixels corresponding to, and having values derived from the monitored particles generated at, the first plurality of locations, c) monitoring a second set of resulting particles generated within the specimen at a second plurality of locations within the region using the second detector, so as to obtain a second image frame, the second image frame comprising a plurality of pixels corresponding to, and having respective sets of values derived from the monitored particles generated at, the second plurality of locations, d) for each of the plurality of pixels comprised by the second image frame: if the configured microscope field of view is different from that for the immediately preceding compound image frame in the series: maintaining the set of derived values of the pixel in the second image frame for use in the compound image frame; or if the configured microscope field of view is the same as that for the immediately preceding compound image frame in the series: combining the set of derived values of the pixel with a set of derived values of a corresponding pixel of each of one or more preceding second image frames in the series for which the microscope field of view is the same as the configured microscope field of view, so as to obtain a set of combined pixel values having an increased signal-to-noise ratio, and replacing the set of derived pixel values with the set of combined pixel values in the second image frame for use in the compound image frame, and e) combining the first image frame and the second image frame so as to produce the compound image frame, such that the compound image frame provides data derived from particles generated at the first and second pluralities of locations within the region and monitored by each of the first detector and the second detector; and displaying the series of compound image frames in real-time on a visual display, wherein the visual display is updated to show each compound image frame in sequence.

The implementations and advantageous features now described may be used in a method according to any of the first, second, or third aspects described in this disclosure, or particular embodiments thereof.

It will be understood that the beam being caused to traverse a first traversal path on the region in a total time that is less than a total time in which the beam is caused to traverse a second traversal path on the region in the context of the second aspect generally describes a first total time required for the beam to traverse the entire first traversal path according to a first set of traversal conditions that is less than a second total time required for the beam to traverse the entire second traversal path according to the second set of traversal conditions. In other words, the traversal can be along either of two paths and according to either of two respective sets of traversal conditions.

Traversal of a path generally refers to the beam, or beam spot, moving along at least a portion of a given traversal path. If the mode is unchanged for the duration of the acquisition of the compound image frame, or more specifically for the duration of the beam being caused to traverse the region for the purposes of obtaining the compound image frame, typically the entire first path or entire second path is traversed. However, if for instance, a mode is switched during the traversal of a region, neither the first nor the second path need be traversed in its entirety.

One approach to increasing the overall rate of traversal of the region is to cause data from one or both detectors to be sampled at fewer locations, or less often, during the traversal. This may be thought of as reducing the spatial resolution at which monitored particle data is captured. Accelerating the acquiring of each compound image frame by way of acquiring fewer data samples to be collected for one or both of the first image frame and second image frame, which typically corresponds to producing fewer pixels in a given image frame, can result in faster updating of the display. In this way, the series of compound image frames may be displayed at a higher frame rate. In some embodiments, accordingly, the causing the beam to traverse the first traversal path, or in some embodiments the region, in the reduced total time, or at the faster average rate, comprises reducing the total number of locations within the region for which the first set of generated particles are configured to be monitored, to less than the total number of locations within the region for which the first set of generated particles are configured to be monitored when the configured microscope field of view is the same as that for the immediately preceding compound image frame in the series. Thus the scanning rate can be altered in dependence upon whether the field of view is the same as that for the previous frame. The said total number of locations within the region is typically an instantaneous, configured number, that may be thought of the intended total number for the region in a given mode. In this way, it may be understood as being similar to the overall rate of traversal, in that it typically refers to the traversal, and monitoring, of the entire region.

However, the actual number of locations need not necessarily be the same as the configured number if, for example, the frame acquisition mode is changed from a "fast" mode to a "slow" mode during the acquisition of a frame, such that the configured number of locations to be monitored in total is increased from a lower total number to a higher total number. It will be understood that, in the event that such mid-frame acquisition mode or rate changes, the actual average rate achieved by the traversal and monitoring will typically be different from either of the configured "fast" and "slow" rates, and the actual total number of locations from which signals are collected in steps (b) and (c) will typically be different from either of the configured larger and smaller numbers. Typically the actual achieved rate and number of locations will be an intermediate value between the two configured values.

It will be understood, in view of this, that the configuring of the plurality of locations to be smaller in number as may be performed in these embodiments, may be thought of as switching to a mode in which the number of sampling locations, or temporal and/or spatial frequency of sampling, is reduced. It would be understood also that the first set of generated particles are configured to be monitored as step (b).

Each of the locations in the first and/or second plurality may, in some embodiments, be defined by a finite area within the region. For example, each of a respective plurality of areas from which first and second sets of particles are monitored may define these locations. Typically, each location in a reduced plurality, when the "fast" acquisition mode is applied, is accordingly defined by, or corresponds to, a larger area than the areas defined by or corresponding to the locations in a greater plurality for that detector or particle set, when the "slow" mode is applied. The causing the number of traverse locations to be less than that when the field of view is unchanged typically thereby causes the configured number of pixels to be reduced in this fast traversal mode, as explained above.

These embodiments that involve the number of locations, and/or corresponding pixels, to be changed, may conversely be understood as causing the beam to traverse the region at the slower average rate, when the configured microscope field of view is the same as that for the immediately preceding compound image frame in the series, comprising increasing the total number of locations within the region for which the first set of generated particles are configured to be monitored, to more than the total number of locations within the region for which the first set of generated particles are configured to be monitored when the configured microscope field of view is different from that for the immediately preceding compound image frame in the series.

Additionally, alternatively to applying such changes to the number of monitored locations in step (b), a similar functionality may be applied in step (c) during the acquisition of a frame. Therefore, in some embodiments, the causing the beam to traverse the region, or the first traversal path, in the reduced total time or at the faster average rate comprises reducing the total number of locations within the region for which the second set of generated particles are configured to be monitored, to less than the total number of locations within the region for which the second set of generated particles are configured to be monitored when the configured microscope field of view is the same as that for the immediately preceding compound image frame in the series.

The applying of a different acquisition rate or mode may, as an alternative or in addition to reducing the resolution or number of pixels, involve reducing the time taken to acquire data for each pixel. Obtaining the derived values more quickly in a "fast mode" when the field of view is changing allows the refresh rate to increase at the expense of signal-to-noise. Conversely, in "slow mode", taking more time to obtain those pixel values when the field of view is unchanging improves the signal-to-noise ratio for the acquired data, since the refresh rate is of less importance when movement, or other changes to the field of view, during navigation of the specimen is halted. Accordingly, in some embodiments, the causing of the beam to traverse the region in the reduced total time or at the faster average rate comprises reducing a configured monitoring duration, which may be understood as a configured average for the entire region and applied, typically, instantaneously at a given time, for which the first set of particles generated at each of the first plurality of locations is monitored. Likewise, the causing of the beam to traverse the region at the slower average rate, as referred to above, may comprise increasing the configured monitoring duration for which the first set of particles generated at each of the first plurality of locations is monitored.

The monitoring duration may likewise be altered for the particles monitored by the second detector. That is, in some embodiments, the causing the beam to traverse the region, or the first traversal path, in the reduced total time or at the faster average rate comprises reducing a configured monitoring duration for which the second set of particles generated at each of the second plurality of locations is monitored.

As alluded to above, a further way in which a change in the total traversal time can be implemented is altering the length of the traversal path. In some embodiments this change involves adjusting the size, extent, or coverage area, of the traversal path.

The configured field of view of the microscope may be thought of as the "default" field of view that the microscope is configured to cover at some point during, typically at the start, of acquiring a compound image frame. It will be understood, however, that during the acquisition of a frame in the series, for some or all of the frame, the field of view that is actually used need not necessarily be the same as the configured field of view. That is, the microscope may be caused to capture an image with a modified field of view, with the configured field of view having nonetheless been used for determining whether the field of view is notionally moving or static, and/or whether to use the "fast" or "slow" acquisition mode. Accordingly, the area covered by, or defined by the extent of, a given traversal path need not be congruent with, and indeed might correspond to only a part of, the configured field of view for a given compound image frame. Relatedly, the configured field of view may be understood as being configured in respect of a compound image frame, rather than necessarily defining its extent.

The configured field of view is typically user-configured, although it is additionally possible for some automation of specimen and/or beam deflection offset to be applied in order to at least partly automate navigation of the configured field of view around the specimen.

Typical embodiments may involve having either or both of the first traversal path and the second traversal path cover, or substantially cover, the entire configured field of view of the microscope. However, it is also envisaged that, as part of acquiring a compound image frame, the field of view might be modified in order to change the time required to scan it, or in other words the time required to traverse a traversal path covering it. The term "cover" as used in this context may be understood as "extend over". Preferably a traversal path "covering" a field of view describes that path having an extent and pattern configured such that particles may be monitored from all parts, or substantially all parts, of the specimen within that field of view during the traversal of that path by the beam. However, this "coverage" may alternatively be understood as the path being congruent with the field of view, that is defining an area and/or a boundary coinciding with that of the field of view.

A "fast" or "dynamic" acquisition mode, for example, may comprise effecting a first traversal time and a corresponding first traversal path that are shorter, respectively, than the second traversal time and corresponding second traversal path. The first traversal path may therefore have a smaller coverage area than the second traversal path. This may be understood as corresponding to the "reduced raster" configuration referred to earlier, for example, or any scan pattern that covers a sub-region on the surface of the specimen that is smaller, that is has a smaller area, than the region corresponding to the configured field of view. In this way, the first traversal path may, in some embodiments, cover a modified field of view, that is a field of view that is modified with respect to the configured field of view of the microscope for a given frame. Typically in such embodiments the modified field of view corresponding to the first traversal path is smaller than, and preferably contained partly or entirely within, the configured field of view. The modified field of view may therefore be understood as corresponding to only a portion, or a sub-region, of the region of the specimen that would be covered by the configured field of view. Typically, the image frames that are captured when operating in such a "fast" mode therefore represent a smaller area than image frames captured in the alternative, "slow" mode. For this reason the resulting smaller compound image frames in the series are preferably displayed on the visual display at a correspondingly reduced size for the purposes of continuity of displayed dimensions and magnification between frames in the series.

Embodiments such as this can advantageously provide an image acquisition and display rate that is faster when the configured field of view is changing than when it is unchanging, by covering only a modified field of view that omits part of the configured field of view for frames acquired in the former case and, preferably, capturing data from across the entire configured field of view in the latter case.

It is alternatively or additionally possible in some embodiments for the field of view that is applied when capturing a frame to be increased for the purposes of operating in the "slow" or "static" mode. Thus in some embodiments the second traversal path covers a modified field of view that has a greater extent than, and preferably partly or wholly contains, the configured field of view. In this way the modified field of view may correspond to a traversal path that is longer than, and requires a greater traversal time than, the configured field of view.

The application of a traversal time or rate that is dependent on whether the field of view is changed or unchanged may be implemented by way of an acquisition mode parameter. Accordingly, in some embodiments, the acquiring the series of compound image frames is performed in accordance with an acquisition mode parameter, wherein, when the acquisition mode parameter equals a first value, the beam is caused to traverse the first traversal path, or the region, at the average rate that is faster than the average rate at which the beam is caused to traverse the second traversal path, or the region, when the acquisition mode parameter equals a second value, and wherein the acquisition mode parameter is set to the first value if the configured microscope field of view is different from that for an immediately preceding compound image frame in the series and is set to the second value if the configured microscope field of view is different from that for an immediately preceding compound image frame in the series. Conversely, in such embodiments, typically, when the acquisition mode parameter equals a second value, the beam is caused to traverse the region at the average rate that is slower than the average rate at which the beam is caused to traverse the region when the acquisition mode parameter equals a first value. This mode parameter may therefore be used to indicate of configure whether the “fast” or “slow” acquisition mode, corresponding to the higher and lower average traversal rates respectively, is to be applied. Thus the acquisition mode parameter may, according to some embodiments, be one and the same as either the first mode parameter described in relation to the first aspect specifically, and/or the second mode parameter described in relation to certain advantageous embodiments thereof. However, it is also envisaged that the acquisition mode parameter described in relation to embodiments of the second aspect may be separate and/or independent from the first and second mode parameters described earlier. Likewise, the first and second values of each of the earlier described mode parameters and the later described acquisition mode parameter may be respectively the same or different.

Typically the value of the mode parameter is set, or at least maintained, at the start of the acquisition process for each compound image frame. In this way, the traversal rate can be advantageously altered on at least a per-frame basis. However, in some embodiments this mode-switching functionality is applied more advantageously still, by way of adjusting the acquisition mode, and instantaneous configured average traversal rate, during the acquisition of a compound image frame and in response to a change in the configured microscope field of view effected during that frame being acquired. Thus, in some embodiments, step (d) is performed during the said traversing of the region by the beam and the said monitoring of the first and second set of particles, and further comprises, for each of the plurality of pixels comprised by the second image frame: if the configured microscope field of view is different from that for an immediately preceding pixel of the second image frame, and if the acquisition mode parameter equals the second value, setting the acquisition mode parameter to equal the first value; or if the configured microscope field of view is the same as that for the immediately preceding pixel of the second image frame, and if the acquisition mode parameter equals the first value, setting the acquisition mode parameter to equal the second value.

It will be understood that, if the configured field of view is changed mid-frame, typically the region corresponding to the field of view may be thought of as corresponding to the field of view of the start of the frame being acquired, or at a given or predetermined point during the acquisition. The field of view may also be thought of as corresponding to more than one field of view, or a combined field of view that encompasses the parts of the specimen surface included in any fields of view through which the microscope was moved, or configured to move, or otherwise changed, during the frame acquisition.

The application of a mid-frame acquisition mode parameter switch can advantageously affect the traversal of the beam over subsequent locations of the plurality. Thereby the switch can affect the rate at which subsequent pixels in the second image frame are obtained. The condition of whether the configured microscope field of view is different from that for an immediately preceding pixel may be evaluated in respect of the time at which a value set for a given pixel is derived, or processed, if the field of view is different from the field of view at the time a value set for an immediately preceding pixel in the frame is derived. The configured microscope field of view being different, in this context, may include there being no immediately preceding pixel, for example if the current pixel being processed or having its value set acquired is the first pixel in the second image frame. This difference in field of view between pixels may be understood as the field of view being changed between the processing and/or acquisition of the previous pixel and that of the current one. The acquisition mode parameter equaling the second value may be understood as the additional condition that the mode parameter is set to a “slow” mode.

A pixel in the second frame being defined as preceding, or immediately preceding, typically refers to that pixel coming before the current pixel in the order in which the pixel values are derived and/or processed. Typically, the pixels are processed in an order corresponding to the order in which signals were obtained from the locations in the region. Based on these conditions, the setting of the acquisition mode parameter to equal the first value is typically performed so as to effect an increase to average traversal rate. It will be understood, therefore, that the mode parameter change in such embodiments depends on both a configured field of view comparison for two pixels and a current mode parameter value.

With reference to the aforementioned condition of the configured microscope field of view being the same for a current pixel as that for the immediately preceding pixel the second image frame, this may be understood as the condition that movement, or changing, of the field of view having stopped, and so being unchanged between the previous pixel and the current pixel being processed or acquired. Additionally, the setting of the acquisition mode parameter to equal the second value is also dependent on the parameter still being set, typically, to a “fast” mode. This setting of the parameter to equal the second value is typically performed so as to effect a decreased average traversal rate.

The capability to change the acquisition mode during the course of acquiring an individual compound image frame, in such embodiments, can provide the benefit of slowing down the beam traversal if the field of view movement or changes are stopped resulting in higher signal-to-noise data being obtained earlier than if the rate change were effected only at the start of the next frame. This advantage is seen particularly in the circumstances wherein changes to the field of view are halted shortly after a compound image frame has begun being acquired in “fast” or “dynamic” mode. In such a situation, it would be necessary for the switch deflecting data at higher resolution to be delayed until substantially an entire frame acquisition duration data. Furthermore, also in absence of this mid-frame switching in such cases, no signal-to-noise improvement would be achieved until after this delay, when the “slow” or “static” acquisition mode can be applied, starting with the following frame.

Likewise, an important advantage achieved by speeding up the traversal mid-frame if the field of view begins changing is that the increase to the refresh rate occurs earlier, and results in easier and more efficient navigation of the specimen for a user or observer. It will be appreciated that, particularly when a mode parameter change causes a configured number of pixels, or image frame resolution, to change before monitored data for a compound image frame is acquired, it may be beneficial in some embodiments to process the affected image frame so as to approve the appearance and intelligibility of the frame, for example for when it is viewed by a user.

In order to implement such image processing, a number of options for constructing the compound image frame for displaying are available, as are various approaches to handling the data that has already been acquired, partway through a traverse, prior to a mode change. For example, data that has been acquired in a "dynamic" mode, at low resolution, for a small number of pixels, can be interpolated at intermediate positions in order to provide equivalent values on a grid of pixels having a higher resolution corresponding to that of image frames acquired in the "static" mode. Similar interpolation may be applied to the compound image frame pixels only, in some embodiments.

In view of the above described advantages, it will be understood that it is beneficial to affect the traversal rate changes in response to mid-frame acquisition transitions between changing and unchanging fields of view immediately. In this way the advantageous effects may be realised more rapidly. Typically, in certain embodiments, the said setting of the acquisition mode parameter to equal the first or second value is performed prior to monitoring particles generated within the specimen at a location within the region corresponding to, or represented by, an immediately subsequent, or immediately subsequently processed, pixel in the second image frame. The immediacy of these mode changes is reflected in responsiveness of improvements to refresh rate score image resolution and/or signal-to-noise ratio enhancements. It will be understood that the obtaining the first image frame may, in some embodiments, comprise some field of view-dependent pixel processing. In particular, it may comprise an analogous treatment to that applied to the second image frame, whereby the signal-to-noise ratio is increased by combining data for corresponding pixels in image frames having the same field of view. Thus, in some embodiments, acquiring a compound image frame further comprises: for each of the plurality of pixels comprised by the first image frame: if the configured microscope field of view is different from that for the immediately preceding compound image frame in the series: maintaining the derived value of the pixel in the first image frame for use in the compound image frame; or if the configured microscope field of view is the same as that for the immediately preceding compound image frame in the series: combining the derived value of the pixel with a derived value of a corresponding pixel of each of one or more preceding second image frames in the series for which the microscope field of view is the same as the configured microscope field of view, so as to obtain a combined pixel value having an increased signal-to-noise ratio, and replacing the derived pixel value with combined pixel value in the first image frame for use in the compound image frame. The condition of the configured microscope field being different from that for the immediately preceding compound image frame in the series may, as discussed above, include there being no immediately preceding image frame, for example if the current frame is the first in a series.

In addition to changing the acquisition mode to a "static" mode in order to improve the signal-to-noise ratio of the acquired data, in some embodiments the process involves aggregating, or binning, groups of pixels in the second image frame, which are typically X-ray pixels, to form an image with fewer pixels to process and to display. It would be understood that such binned pixels will have improved signal-to-noise. The acquiring a compound image frame may therefore, in some embodiments, further comprise: grouping together the pixel value sets of one or more subsets of pixels in the second image frame so as to obtain one or more respective sets of aggregate pixel values, or sets of "super pixels" having values. For example, each aggregate value set may correspond, preferably, one-to-one, to a subset of pixels. The acquiring the compound image frame may comprise, in such embodiments, replacing each of the one or more subsets of pixels in the second image frame with an aggregate pixel, or "superpixel", having a set of values equal to the respect set, or corresponding to the subset of pixels, of aggregate pixel values.

Typically, each of the first detector and the second detector views the region of the specimen under or according to the configured set of microscope conditions. In each of the obtained first and second image frames, each pixel may represent, or have a value according to, a count of the particles monitored by the detector generated at a location on the sample corresponding to that pixel, or, for example, may indicate, or have a set of values indicating, the energy distribution of those monitored particles. In some embodiments, one or more pixels in either or both of the first image frame and second image frame may have a set of values corresponding to a histogram of photon energies obtained at the corresponding location, which may typically correspond to a small area, on the specimen surface. It will be understood that the number of values in each set may vary, in dependence on the monitored photon energies.

In some embodiments, during the acquiring of a compound image frame, the combining of the pixel values for the respective second image frame with corresponding pixel data of previously acquired second image frames corresponding to the same locations in the specimen may be performed automatically dependent upon the field of view being the same as that for the previously acquired second image frames. If the field of view is intended to be stationary, that is to say the configured field of view is stationary, but there is some small drift in position, for example due to thermal effects on stage mechanics or beam deflection electronics, the difference in position between successive image frames may be determined by cross correlation of successive electron images (as described, for example, at https://en.wikipedia.org/wiki/Digital_image_correlation_and_tracking) and the measured drift used to ensure that pixel values are only combined for successive frames where the data arises from the same position on the specimen.

During the combination process for pixel values for the second image frame, the configured microscope conditions being the same as those for a previous second image frame, which may be stored for example in memory or any sort of machine-readable medium, may be thought of as the content of the signal acquired for the pixel being the same. It will also be understood that, in embodiments where data corresponding to a second (or first) image frame is stored, for instance for use in a subsequent frame in the series in "accumulate" mode, pixel data does not necessarily have to be stored for every position of the frame. For example, if no change is made between acquiring the second image frame in question and the previous image frame to the focus, astigmatism, magnification, acceleration voltage of the electron beam or other type of charged particle beam, the measurement for the pixel will typically constitute a repeat measurement of the previous pixel value for that location on the specimen, unless the specimen or the scan position has moved, and so can be used to improve the signal-to-noise ratio for that pixel. In other words, the configured microscope conditions being the same maybe thought of as the microscope conditions in accordance with which the second image frame was acquired being the same as the microscope conditions in accordance with which previous second image frames were acquired.

The displaying of the compound image frames in real-time typically comprises processing and displaying the image data as soon as it is acquired, so that it is available virtually immediately. In this way, a user is able to use the real-time compound image frames as feedback to guide the navigation around the specimen. For such live navigation, examples of approaches to the interaction with the user and of suitable methods to compose, format, and display compound image frames are described in WO 2019/016559 A1 at pages 8-10. Techniques such as those described in WO 2012/110754 A1 may be used for combining image frames into a colour composite image. The "real-time" display may be understood to mean that there is substantially no appreciable delay between a user causing a navigation action and that action being represented on the visual display, in the form of a moving image or video comprising the displayed compound image frame series.

A change in the field of view may be brought about, for instance, by the user altering the magnification so that the focused electron beam is deflected over a smaller or larger region on the specimen. Alternatively, the user may move the stage or holder on which the specimen is supported so that the specimen is moved relative to the focused electron beam and thus the field of view accessed by the deflected electron beam moves to a new region of the specimen surface. The field of view may also be changed by altering the beam deflection so that the focused electron beam is directed to traverse a different region on the specimen. Microscope conditions such as beam voltage may also be altered which will change the contrast in the electron image and also the information content of additional signals. In any of these cases, the instant replacement of the existing image data with the newly-acquired data will allow the user to see the new field of view within a single frame time. If the frame time is sufficiently short, the user will be able to use the visual display unit to track features on the surface of the specimen while the field of view is changing.

If after any frame of data acquisition the field of view or microscope conditions are the same as for the previous frame, then the acquisition mode typically changes to a mode where the S/N of the displayed image is improved. This may be through an increase in time spent in accumulating data for a frame and/or through signal averaging or accumulation of data from successive frames. Thus, in some embodiments, if the user is moving the field of view over the surface of the specimen to find interesting regions, the user will be able to see the combination of the specimen shape and form provided by the electron image and the complementary information on material composition or properties provided by additional signals. As soon as an interesting region comes into view, the user can stop the movement and the signal-to-noise will rapidly improve without any interaction from the user or interruption of the analysis session.

The inventors have discovered that even if an additional signal gives a single frame of data with poor S/N, the image is often enough to give a rough location of interesting regions.

Furthermore, as successive frames are displayed while the field of view is changed, the noise in each frame is different and the eye/brain combination achieves a temporal averaging effect which allows the user to recognise a moving feature that may be obscure in a single frame of data. As soon as the user sees an interesting feature, if they stop the movement, automatically signal-averaging may be started automatically so that the visibility of the feature will improve rapidly after a few frames are recorded.

The inventors have recognised that the ability to see moving features in successive frames of noisy data can be exploited further by increasing the average rate at which the beam is caused to traverse the region in order to increase the frame rate at which new compound images can be generated for display. Increasing the frame rate will reduce the effective acquisition time per pixel to monitor second particles and worsen the S/N but will enable faster moving features to be imaged without smearing and the rate can be optimised to allow the user to track features effectively.

The inventors also discovered that when the field of view is changing, it is more difficult for the eye/brain to discern fine detail in the moving image. Therefore, the displayed image can have lower resolution (fewer pixels) when the field of view is changing, without affecting the user's ability to track moving features. In order to generate a lower resolution second image frame, the sets of pixel values for neighbouring pixels can be aggregated or summed to give a set of pixel values corresponding to a single "superpixel" representative of a larger area on the specimen. Thus, a second image frame can be prepared that covers the same region on the specimen and uses "data binning" to prepare a reduced number of "superpixels". The same effect can be achieved by monitoring second particle data while the electron beam is traversing a region equivalent to the area covered by a "superpixel". Alternatively, the electron beam can be positioned on a series of grid points at coarser spacing to obtain monitored second particle data at fewer pixel positions. Since each set of pixel values may require considerable computational cost to derive the values that will be used to generate the compound image for display, the total computing time can be substantially reduced by reducing the number of pixels per frame. Furthermore, for the same frame time, if the total acquisition time is effectively apportioned between a fewer number of pixels, each set of pixel values will give rise to derived values for the compound image that have improved S/N compared to an image with more pixels. Even though the number of pixels per frame may be reduced, the visual displayed image can be kept at the same size by well-known techniques such as pixel replication, interpolation or "upscaling" that map image data with a given pixel resolution on to a visual display that has a different pixel resolution. Furthermore, if the number of pixels in the second image frame is less than the number of pixels in the first image frame, the sets of pixel values for the second image frame can be similarly increased by replication, interpolation or upscaling if necessary to provide the same number of pixel values as for the first image frame so facilitate preparation of the compound image frame.

To achieve this step function improvement in navigation efficiency where the user can take decisions "on the fly", an important advantage is that the user can view both images or more, in embodiments with three or more detectors, simultaneously so that all images are at least within the range of peripheral vision of the user. Preferably, the additional image information on material composition or properties is provided as a colour overlay on the electron image to provide the equivalent of a "heads up" display, that presents additional data without requiring the user to look away from the electron image.

As noted above, the first detector is typically an electron detector. However, it is envisaged that other types of monitoring equipment may be used.

In typical embodiments, the first detector is adapted to monitor resultant particles that provide data including either or both of topographical information and specimen material atomic number information about the region of the specimen. Such data may typically be provided by secondary electron or backscattered electron detectors. Thus such detectors may be suitable for rapidly providing image frames comprising information suitable for use by a user to quickly navigate the field of view around the specimen surface.

In some embodiments, the second detector is adapted to monitor resultant particles that, for the configured microscope conditions, are generated within the specimen at a rate less than one tenth of the rate at which resultant particles that the first detector is adapted to monitor are generated within the specimen. For example when the method is used with an electron microscope, typically, for given electron microscope conditions, resultant emitted X-rays generated in response to an electron beam impinging upon the specimen are generated at a rate that is an order of magnitude or more less than the rate at which emitted electrons are generated. The rate in this context refers to the number of particles generated per second, be those particles comprised of matter or electromagnetic radiation. In some embodiments, the rate at which the particles which the second detector is adapted to monitor are generated is one hundredth that of the rate at which particles that the first detector is adapted to monitor are generated.

In some embodiments, for example involving electron backscatter diffraction analysis, such a difference in first and second particle generation or monitoring rates may not be present. However, the S/N of signals derived from data for the second particle may still be significantly lower than the S/N of the signals from the first particle data.

The second detector may, in different embodiments, be adapted to monitor different types of particles, for example X-rays, secondary electrons, and backscattered electrons.

In some embodiments, the second detector is any of an X-ray spectrometer, an electron diffraction pattern camera, an electron energy loss spectrometer, or a cathodoluminescence detector.

In some embodiments, monitoring the second set of particles so as to obtain the second image frame comprises: obtaining two or more signals of different types from the second detector, so as to obtain a sub-image frame corresponding to each of said signals, and combining the first image frame and second image frame comprises combining the first image frame with one or more of said sub-image frames.

Thus in some embodiments sub-image frames may be obtained by processing the data from the second detector in order to derive different types of information. For example, an X-ray spectrum that provides a measure of the number of photons recorded for each of a set of energy ranges can be processed to measure the number of photons corresponding to particular characteristic line emissions, even when the line emissions are spread over a range of energies such that recorded data from two different line emissions overlap in terms of energy.

In some embodiments, an electron diffraction pattern recorded by a second detector, such as an imaging camera, can be processed to determine the crystalline phase of the material under the electron beam and the orientation of that phase so that the sub images could be generated corresponding to different phases and to different crystalline orientations.

It follows that, in some embodiments, multiple signals may derived from the same detector. Typically in such embodiments, the second detector may output two or more signals of different types, and these may correspond to monitored particles of different types, and may be used to obtain different sub-image frames. For example, different types of signals which may be output may include: a spectrum obtained by an X-ray spectrometer, an electron diffraction pattern obtained by a camera sensitive to electrons, and a spectrum obtained by an electron energy loss spectrometer or a cathodoluminescence detector. Any of these signal types may be used to derive either of the first and second image frames, or may be used to derive a sub-image frame. Accordingly, in some embodiments, monitoring the second set of particles so as to obtain the second image frame comprises: monitoring two or more sub-sets of the second set of particles, each of said sub-sets corresponding to a different type of signal obtained from the second detector, so as to obtain a sub-image frame corresponding to each of said sub-sets.

Some embodiments include a third detector of a different type to the first and second detectors. For example, each of the first, second and third detectors may be any of a secondary electron detector, a backscattered electron detector, and an X-ray detector.

As noted above, a pixel of an image frame may represent, or have a value indicating the energy distribution of the monitored particles. This may be achieved by way of obtaining two or more sub-image frames, that is sub-sets or components of an image frame, each corresponding to a different range of particle energies. Accordingly, in some embodiments, monitoring the second set of particles so as to obtain the second image frame comprises: monitoring two or more sub-sets of the second set of particles, each of said sub-sets corresponding to a different particle energy range, so as to obtain a sub-image frame corresponding to each of said sub-sets, wherein each sub-image frame comprises a plurality of pixels corresponding to, and derived from the monitored particles comprised by the corresponding sub-set and generated at, the plurality of locations within the region, and combining said sub-image frames together so as to produce the second image frame, such that the second image frame provides data derived from, for each of the plurality of pixels, the particles generated at the corresponding location within the region and comprised by each of said sub-sets.

In this way, the second detector may obtain, for each compound image frame, more than one associated image (sub-image frame) so as to monitor resultant particles of different energies, or in different energy bands, separately. The separate sub-images may be combined together in a manner that allows the pixel values or intensities for the plurality of constituent pixels, corresponding to the particle counts for the corresponding specimen locations, for each of the sub-image frames to be distinguished. This may be achieved, for example, by assigning a different colour to, or rendering in a different colour, each of the sub-image frames. This may be performed such that the visible contribution to the resultant colour at a given location or pixel in the second image frame, and consequently in the compound image frame, provides a visual indication of the intensity of monitored particles in the corresponding energy band or sub-set generated at that location.

Thus, in some embodiments, a composite colour second image frame, based on the sub-image frames, may be formed and then combined with the first image frame to form the compound image.

For example, in embodiments wherein the second detector is an X-ray detector, for each compound frame in the series, the second detector monitors the intensity for characteristic emissions of multiple chemical elements, by way of monitoring a plurality of sub-sets of particles the energy ranges of which correspond to the characteristic energies, or energy bands, of those chemical elements. Thus from a single X-ray detector, multiple sub-images are obtained, each sub-image corresponding to a different chemical element.

In some embodiments, the two or more sub-image frames are not combined to form the second image frame, but are instead processed separately, in accordance with step (d) of the method, before being combined, together with the first image frame, to form the compound image frame. Accordingly, it is possible in different embodiments for any of the sub-image frames, or any of the image frames, to be acquired in both "accumulation" and "refresh" modes.

Suitable methods for combining data from the first and second image frames to create and display compound image frames are described in WO 2019/016559 A1 at pages 15-17. For each compound image frame, the first and second image frames may be combined to form a single image frame containing data acquired by both of the first and second detectors. This is preferably indicated visually to a user in a manner that allows the first particle set and second particle set information for each location in an image being displayed to be individually distinguished.

In some other embodiments, rather than overlaying the two image frames, combining the first image frame and the second image frame is performed by displaying the first and second image frames side by side. Thus combining the first image frame and the second image frame so as to produce the compound image frame may comprise juxtaposing the first and second image frames. Preferably, in such embodiments, the two image frames are positioned alongside one another such that they are both visible simultaneously within the field of vision of a user when the compound image frame is displayed on the visual display. In these embodiments, therefore, the compound image frame will typically be at least twice as large, that is comprising at least twice as many pixels, as each of the individual first and second image frames.

The microscope conditions under which the first and second image frames are obtained may comprise a number of different configurable conditions. Those conditions which may be configured for the electron column of the electron microscope may comprise magnification, focus, astigmatism, accelerating voltage, beam current, and scan deflection. That is, the aforementioned list of microscope conditions may be configured for the charged particle beam. The position and orientation may be configured for the specimen, or in particular configured for a specimen stage adapted to hold the specimen. In other words, the spatial coordinates, which may include position in the X, Y, and Z axes in a Cartesian coordinate system, as well as degrees of tilt and rotation of the specimen. Brightness and contrast may be configured for each of the first and second detectors.

Accordingly, a field of view for the electron microscope may typically be configured by way of configuring microscope conditions such as the sample stage position and orientation, the magnification, and the scan deflection, that is the degree of deflection applied to the scanning charged particle beam.

The combination of pixels from an image frame in some embodiments may not necessarily be limited to the second image frame only. In some embodiments, the use of the "accumulation" mode of obtaining image frames may be applied to the first image frames, as well as to the second image frames. That is, the acquiring of a compound image frame may also comprise, for each pixel of the first image frame, if the configured microscope conditions are the same as those for a stored first image frame of an immediately preceding acquired compound frame in the series, and if the respective pixel corresponds to a location within the region to which a stored pixel comprised by said stored first image frame corresponds, combining the value of said stored pixel with the value of the pixel so as to increase the signal-to-noise ratio for the pixel. Applying the signal averaging or accumulation mode of obtaining the image frames to the image from the first detector may be advantageous in embodiments wherein the signal-to-noise ratio of signals from the first detector is low, or lower than a desired threshold.

The frame rate of the visual display, that is the rate at which successive compound images in the series are displayed thereon, may vary between different embodiments, and may be configurable. In some embodiments, the frame rate at which the compound image frames are displayed is at least 1 frame per second, preferably at least 3 frames per second, and more preferably 20 frames per second. In some embodiments, a single compound image frame is processed at any given time. In such embodiments, the example frame rates set out above correspond to compound image acquisition times, or processing time, of 1 second or less, 0.3 seconds or less, and 0.05 seconds or less, respectively.

In some embodiments, the rate at which the series of compound image frames is acquired and displayed is at least 10 frames per second, preferably at least 18 frames per second, more preferably at least 25 frames per second, more preferably still at least 50 frames per second. Preferably, therefore, the series of compound image frames is displayed in the form of a moving image, preferably the display frame rate is equivalent to a video frame rate.

In preferred embodiments, combining said storage pixel with the pixel so as to increase the signal-to-noise ratio for the pixel is performed by way of signal averaging or signal accumulation. The output from a detector may be regarded as a signal, and thus the noise-reduction techniques of signal averaging and signal accumulation, wherein an average or sum over a set of replicate measurements, that is a set of measurements under the same conditions for a given pixel, or a pixel corresponding to a particular location within a region, may be used.

In accordance with a third aspect of the invention there is provided a method for analyzing a specimen in a microscope, the method comprising:

using two modes of acquisition to obtain a series of compound image frames using a first detector and a second detector, different from the first detector, wherein acquiring data for a compound image frame in a first mode comprises:

a1) causing a charged particle beam to traverse over a region of a specimen in time T1, the region corresponding to a configured field of view of the microscope, a2) monitoring, using the first detector, a set of resulting first particles generated within the specimen so as to obtain a first image frame comprising N1 pixels where a pixel value corresponds to monitored first particles from a vicinity of a position within the region, a3) monitoring, using the second detector, a set of second resulting particles generated within the specimen so as to obtain a second image frame comprising N2 pixels where a pixel has a set of values derived from monitored second particles from a vicinity of a position within the region, a4) if the configured microscope field of view is different from that for an immediately preceding compound image frame in the for each pixel in the second image frame using the values for a pixel as the values that will be used to generate the next compound image frame in the series a5) if the configured microscope field of view is the same as that for the immediately preceding compound image frame in the series, changing to a second mode of acquisition wherein acquiring a compound image frame in the second mode comprises:

b1) causing a charged particle beam to traverse over a region of a specimen in time $T_2$, the region corresponding to a configured field of view of the microscope, b2) monitoring, using the first detector, a set of resulting first particles generated within the specimen so as to obtain a first image frame comprising M1 pixels where a pixel value corresponds to monitored first particles from a vicinity of a position within the region, b3) monitoring, using the second detector, a set of second resulting particles generated within the specimen so as to obtain a second image frame comprising M2 pixels where a pixel has a set of values derived from monitored second particles from a vicinity of a position within the region, b4) for each pixel of the second image frame if the configured microscope field of view is the same as that for the immediately preceding compound image frame in the series, combining the set of values for the pixel with one or more sets of values of the corresponding pixel in previously acquired second image frames from the same field of view so as to increase the signal-to-noise ratio for the values for the corresponding pixel that will be used to generate the next compound image frame in the series, b5) if the configured microscope field of view changes from that for an immediately preceding compound image frame in the series, changing to the first mode of acquisition and, c) using the sets of pixel values for second particles intended for generating the new compound image frame and the pixel values for first particles to produce the compound image frame, such that the compound image frame is a spatial representation of the region where values for a pixel at a location in the compound image frame are derived from data derived from the particles generated at the corresponding location within the region and monitored by each of the first detector and second detector, and displaying the series of compound image frames in real-time on a visual display wherein the visual display is updated to show each compound image frame in sequence so as to allow an observer to identify potential features of interest when the field of view is static or changing, wherein the time T1 to traverse the region in the first mode is less than the time T2 to traverse the region in the second mode. This method may also be understood as being provided as an embodiment according to the second aspect. The first and second times, T1 and T2 may, for example, be understood as corresponding to the total traversal times discussed earlier in this disclosure, in relation to the second aspect. Thus the mode-switching functionality may be defined in terms of two discrete modes of acquisition, typically involving switching between those modes based upon field of view movement or other changes.

In accordance with a fourth aspect of the invention there is provided an apparatus for analyzing a specimen in a microscope, the apparatus comprising an X-ray detector, which is preferably the second detector according to any of the first, second, and third aspects, a processor, and a computer program, which, when executed by a processor, causes the processor to carry out a method according to any of the first, second, and third aspects.

Such an apparatus may be suitable for carrying out a method according to any of the first, second, and third aspects.

In some embodiments, the apparatus is suitable for displaying signals generated while a focused electron beam in the electron microscope is scanned over a two-dimensional region on the surface of the specimen wherein a first signal is from an electron detector, wherein at least one auxiliary signal is derived from a different detector that provides information on individual chemical element content or material properties other than atomic number, wherein each signal is measured at a two-dimensional array of electron beam positions covering the region and the corresponding pixel array of measurement results constitutes a digital image for a field of view covering the region, wherein a visual display is used to show the digital images for all signals so that the images are within the range of peripheral vision of the user or combined into a single composite colour image, wherein a complete set of pixel measurements covering the field of view for all signals and preparation of the visual display is performed and completed in a short time period, wherein the complete set of pixel measurements for all signals covering the field of view and update of the visual display are repeated continuously, wherein successive measurements of at least one auxiliary signal at the same pixel position are used to improve the signal-to-noise of the measurement at that pixel provided the field of view or microscope conditions are not changing, wherein if there is any change in the field of view or microscope conditions, the next measurement of a signal at the same pixel position is used to replace the previous measurement, wherein the short time period is sufficiently small that image displays are updated fast enough for the observer to identify moving features when the field of view is being altered.

In such embodiments, typically the signal-to-noise of the displayed result of more than one measurement of a signal is improved by using Kalman averaging of the measurements or by summing measurements and altering the brightness scaling according to the number of measurements.

In this way, when repeat measurements for a pixel or a location on the specimen are obtained in multiple, successive second image frames in the series of compound image frames being acquired by the apparatus, a Kalman recursive filter may be used to increase the signal-to-noise ratio using the values of the multiple pixel measurements. In some embodiments, the improvement to the image signal is achieved by adding together the values of successive pixel measurements and adjusting the brightness according to the number of measurements, that is number of frames for which the pixels are being added together by the apparatus.

Typically, the short time period is less than 1 second, preferably less than 0.3 seconds and ideally less than 0.05 seconds. Thus the apparatus may be configured to perform and complete the preparation of the visual display sufficiently quickly for no noticeable delay, or minimal delay to be experienced by a user of the apparatus.

The apparatus may be configured to automatically identify when the field of view is changing, in order to switch from an "averaging" or "accumulating" mode wherein successive frames in a series are added together, to a "refresh" mode. In some embodiments, the field of view is regarded to be changing if the specimen is being moved or the scanned region is being changed intentionally under user control.

In some embodiments, a change in the field of view or microscope conditions is detected by mathematical comparison of a new digital image with one acquired earlier. The apparatus may be configured to compare successive frames in the acquired series in order to identify changes to the field of view. The apparatus may be configured to operate in "refresh" mode for parts of the specimen as they are introduced into the field of view as the user navigates the field of view around the specimen, while operating in "accumulating" mode for parts of the specimen that remain within, while moving within, the field of view.

Typically, an auxiliary signal is derived from, the spectrum obtained by an X-ray spectrometer, an electron diffraction pattern obtained by a camera sensitive to electrons, the spectrum obtained by an electron energy loss spectrometer, or a cathodoluminescence detector.

In some embodiments, a scanning electron microscope comprising the apparatus according to the fourth aspect is provided. Thus an electron beam instrument, in particular an electron microscope that is suitable for and/or configured to carry out the advantageous analysis method, may be provided.

In accordance with a fifth aspect of the invention there is provided a computer-readable storage medium having stored thereupon a program code configured for executing the method according to any of the first, second, and third aspects.

In accordance with a sixth aspect of the invention there is provided a computer program comprising instructions which, when executed, cause an apparatus to perform a method according to any of the first, second, and third aspects.

BRIEF DESCRIPTION OF THE DRAWINGS

Examples of the present invention will now be described, with reference to the accompanying drawings, in which.

DESCRIPTION OF EMBODIMENTS

With reference to FIGS. 1-6 and 8 a method and apparatus for analysing a specimen in an electron microscope according to the invention are now described.

Figure 8:
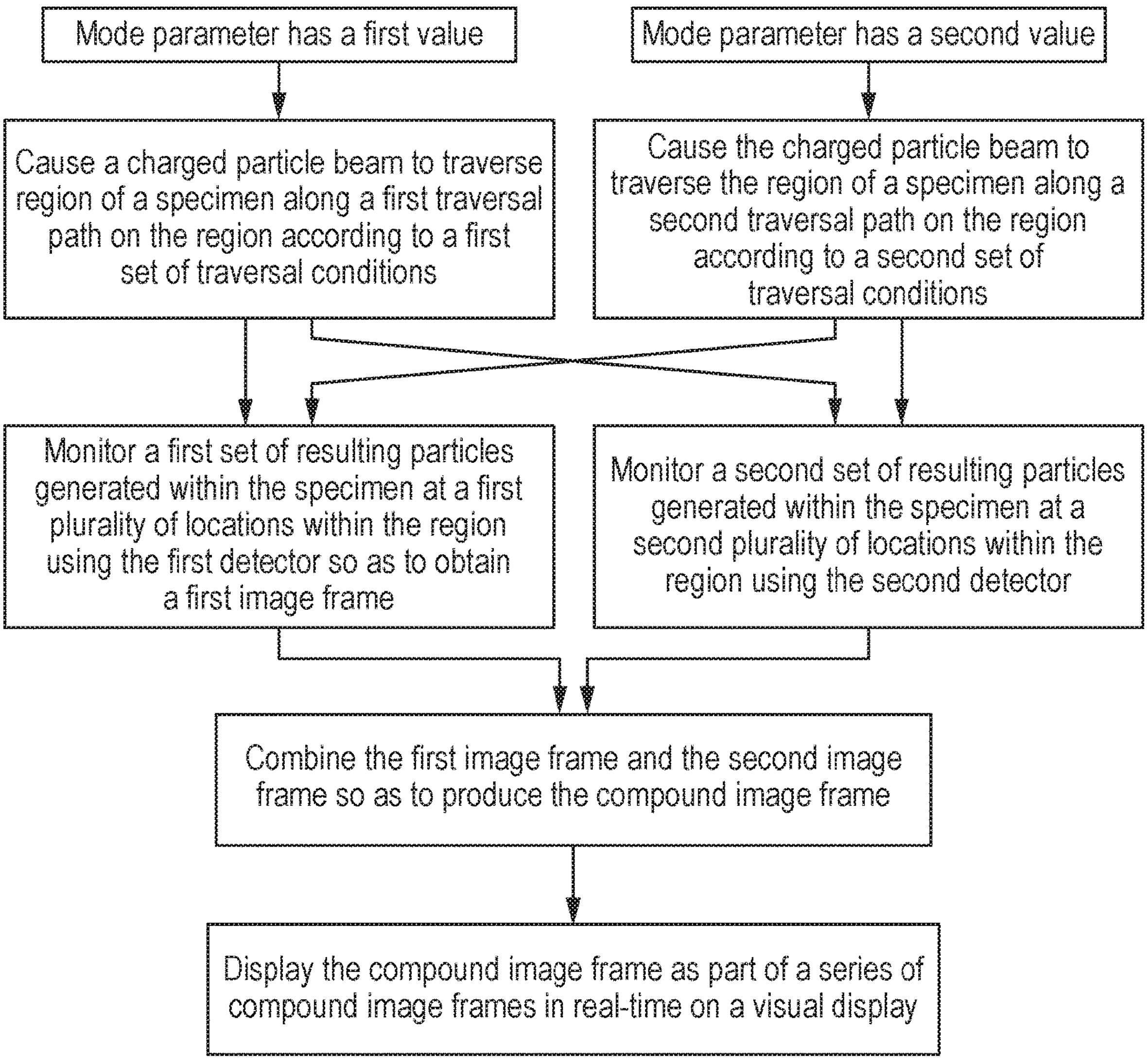
FIG. 8 is a flow diagram showing steps of an example method according to the invention.

A simplified representation of key steps of one example method according to the invention is shown in FIG. 8. The flow chart shows the steps for capturing and displaying a single compound image frame in the series. The charged particle beam is caused to traverse according to the first (fast) scanning mode (left-hand path) or according to the second (slow) scanning mode (right-hand path) if the mode parameter has the first or second value respectively. Although not shown explicitly in this simplified view, the mode parameter value may be changed, once or more times, before traversal for a given frame is complete. In such cases the actual path of the beam is, in this example, caused to switch between the two paths and corresponding conditions accordingly.

Regardless of the mode parameter value, two sets of particles, in this example electrons and X-rays photons. are monitored by the respective first and second detectors. The frames acquired by that monitoring are combined to produce the compound image frame. That frame is then displayed, as part of a real-time updating stream, video, or sequence of frames, on a visual display, thereby facilitating analysis of the specimen. The adaptable scanning mode beneficially allows the scanning mode to be changed between one that provides a rapid visual response and high display refresh rate and one that can provide more, higher-quality, and less noisy image data. The mode parameter may be changed automatically to produce a rapid frame rate if the user reconfigures the microscope to change the field of view (e.g. by moving the specimen stage) or to switch to a slower scan when the user has stopped issuing instructions to change the field of view.

Figure 3:
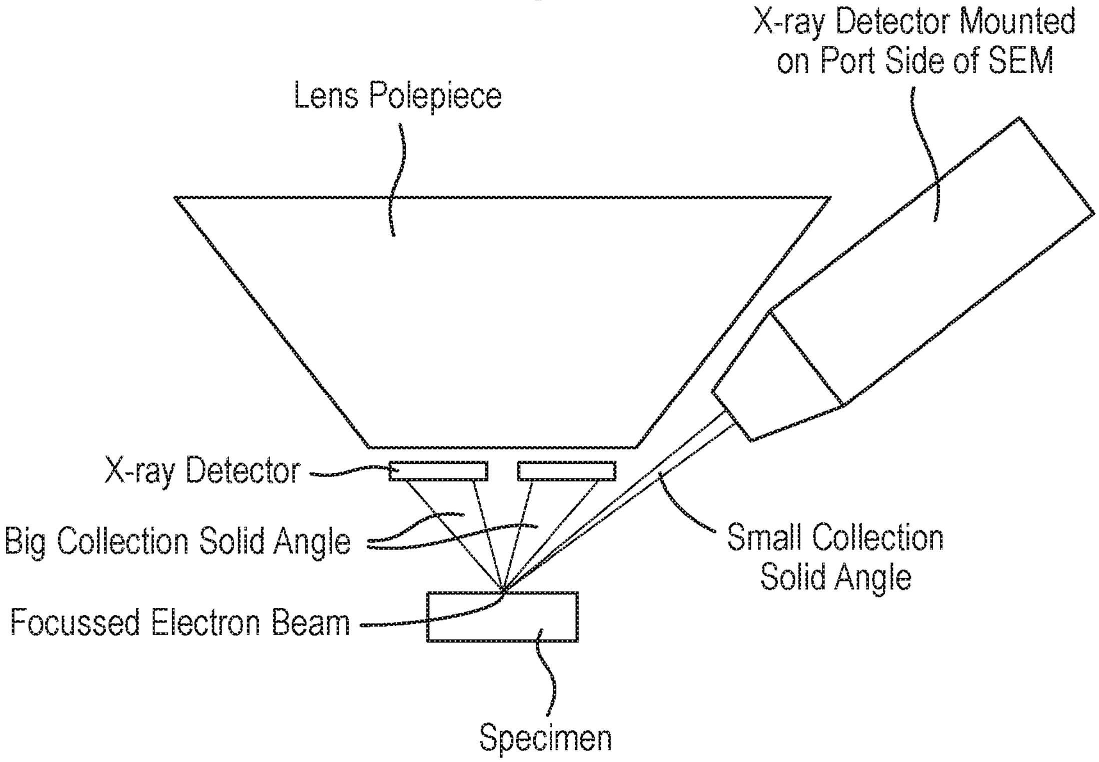
FIG. 3 is a schematic diagram showing a scanning electron microscope arrangement in which a detector is positioned between the specimen and the final lens polepiece of the microscope.

Live imaging during the analysis may be enhanced by a sub-polepiece detector having a high solid angle. Such an arrangement is depicted in FIG. 3. The ability for the user to interact with the visual display to rapidly locate regions of interest on the specimen is greatly enhanced if the second particle detector, that supplies the chemical or material information to augment the first detector image, produces a signal with high S/N. A conventional X-ray detector, mounted on a side port of a SEM, has a small collection solid angle for X-rays. However, an X-ray detector mounted below the pole piece of the electron lens with sensors surrounding the incident electron beam and sensing areas facing the specimen can achieve much higher total collection solid angle for all sensors. With a big collection solid angle, the S/N for the derived X-ray signals is much higher and an acceptable image for tracking moving features can be obtained with a much fast electron beam traverse of the field of view region on the specimen. This allows the frame update rate for the compound image frames to be faster when the field of view is changing so that more rapid changes can be observed.

Figure 1:
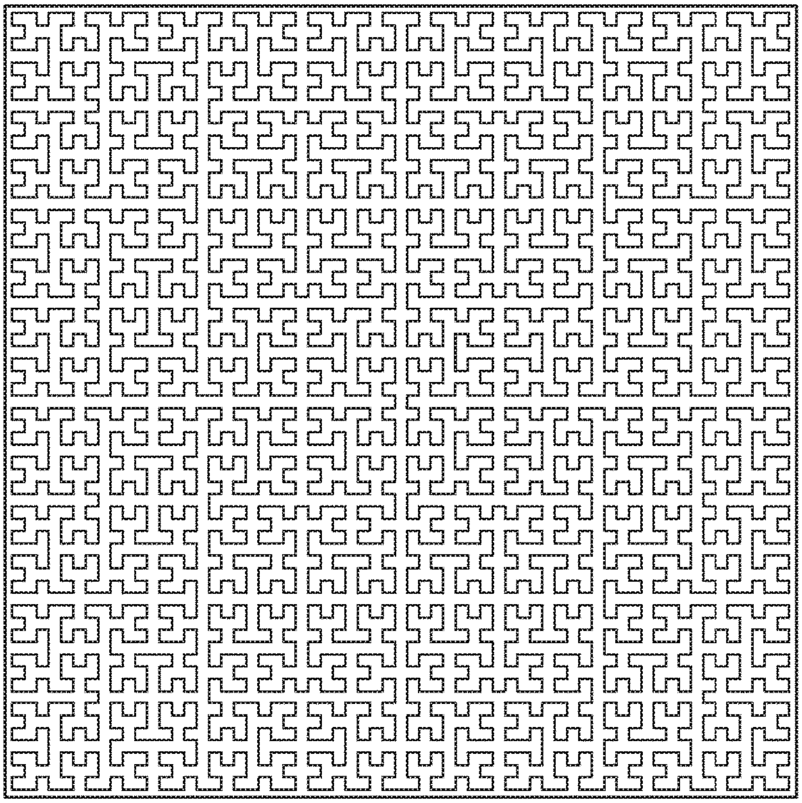
FIG. 1 shows an example scan pattern for an electron beam traversing a region on a specimen.
Figure 2:
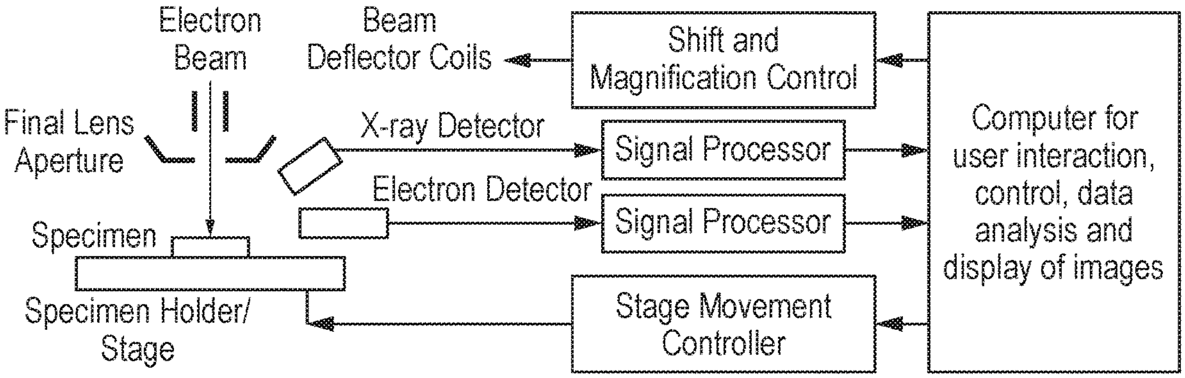
FIG. 2 is a schematic diagram showing the configuration of a scanning electron microscope system for recording electron and X-ray images from a specimen in accordance with the prior art.
Figure 4:
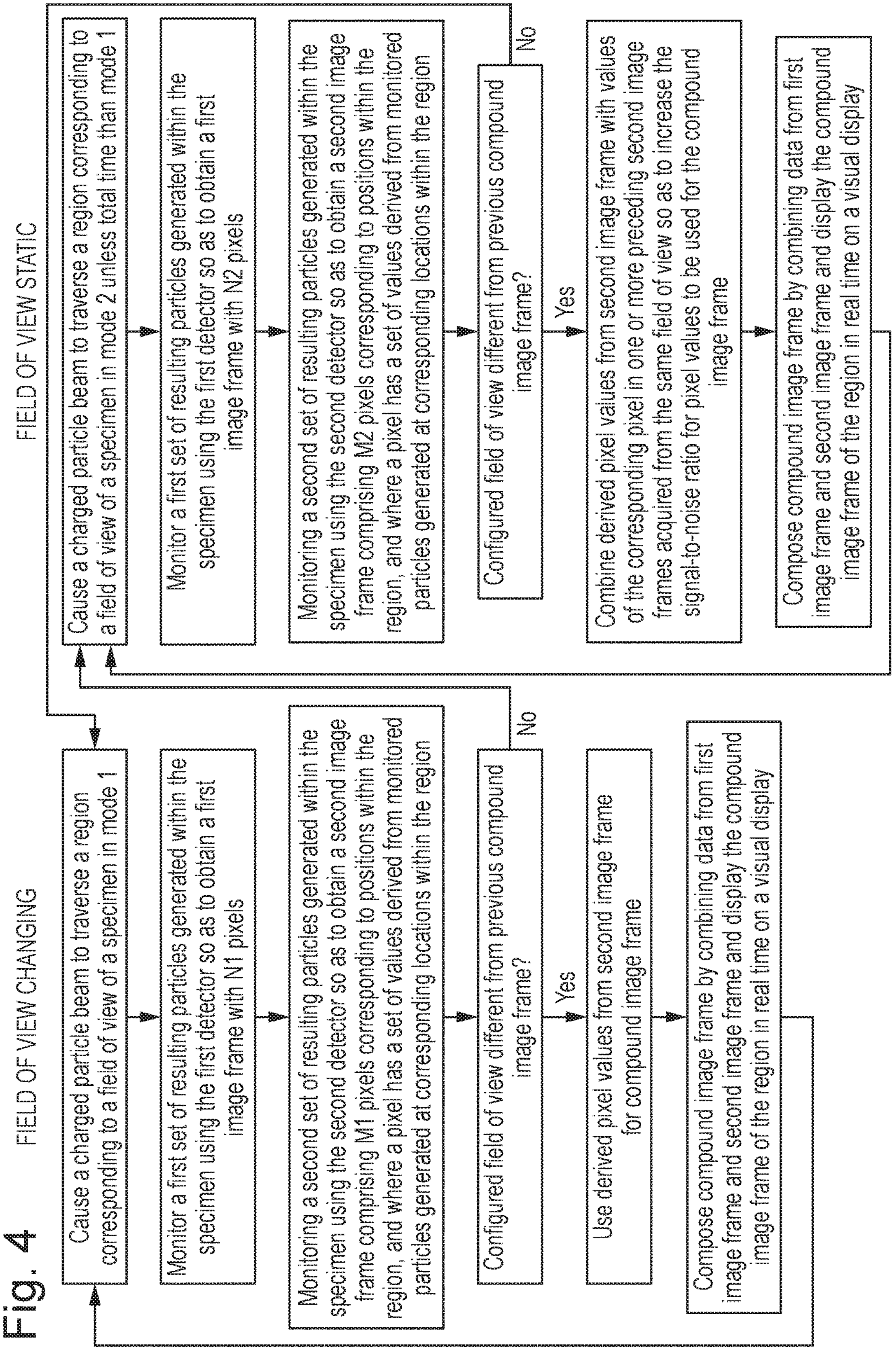
FIG. 4 is a flow diagram showing an example method according to the invention.

A further example method, which advantageously also includes adaptable frame processing in dependence on configured field of view movement, as illustrated in the flow diagram of FIG. 4, may be performed using an electron microscope such as that of the arrangement shown in FIG. 2 or FIG. 3. The method involves acquiring a series of compound image frames, and the acquisition of a compound image frame is illustrated by the steps in FIG. 4. The compound image frames are acquired, in the present example, at a predetermined frequency for each of a first, “fast” or “dynamic” mode and a second, “slow” or “static” mode. The frequency in the first mode is greater than that in the second mode, and the resulting display updates therefore occur at a faster rate when operating in the first mode than in the second mode. In other examples multiple predetermined frequencies or a variable frequency may be applied for either or both of the modes.

As the flow diagram illustrates, the mode that is applied depends upon whether the configured microscope field of view is changing or static. In the present example, the first mode, or “mode 1”, involves monitoring the first set of particles generated at N1 locations, to obtain an image frame comprising N1 pixels, and monitoring the second set of particles generated at N2 locations, to obtain an image frame comprising N2 pixels where N1 and N2 are integers. Likewise, the second mode, or “mode 2” involves monitoring the first set of particles generated at M1 locations, to obtain an image frame comprising M1 pixels, and monitoring the second set of particles generated at M2 locations, to obtain an image frame comprising M2 pixels where M1 and M2 are integers. In order to effect a faster overall scan rate in the first mode than the second mode, in the present example, $N1<M1$, and $N2<M2$. In other examples, however, either of these inequalities might not be applied, and the number of locations for either of the first and second sets of monitored particles may be unchanged between the first and second modes. In the present example, and other examples, the configured average time taken to monitor particles from a given location in the first and second pluralities thereof may be less for the first mode than for the second mode. This may be achieved by way of a faster continuous scan or a shortened dwell time for monitored locations when in “dynamic” mode.

Suitable values for the numbers of pixels and locations in the above-described example are as follows. For example, mode 1 would have N1 equal to 49,152 and N2 equal to 12,288. Switching to mode 2, the number of locations could quadruple, giving M1 equal to 196,608 and M2 equal to 49,152. In this example, $N2<N1$ and $M2<M1$ because the X-ray data is binned so that groups of 4 pixels are combined into one aggregate “superpixel” to improve S/N. If the image frame were acquired with a typical aspect ratio of 4:3, this would result in a first image frame of 256×192 pixel and a second image frame of 128×96 pixel in the first mode, and a first image frame of 512×384 pixel and a second image frame of 256×192 pixel in the second mode. There is no need for N1 and M1 and N2 and M2 to change by the same factor, as the number of locations will depend on the use cases, acquisition conditions and samples to be analyzed. In that sense, N1, M1, N2 and M2 can vary up to, and possibly in excess of 4,194,304 (2,048×2,048), and may be a small to, but not limited to, 3,072 (64×48).

In the present example, the acquisition mode is switched, during the acquiring of a frame, from the first mode to the second mode if it is determined that the configured field of view is different from that of the previous frame in the series, and from the second mode to the first mode if it is determined that the field of view is different from that of the previous frame. This switch is indicated in the flow diagram to be made immediately, such that the frame acquiring procedure is started anew in the switched mode. However, in various examples the switch may be made at different times during the acquiring cycle. For instance, the switch may be made after the acquisition of the current frame has been completed. In preferred examples, however, the mode is switched as soon as the condition for it is identified. In such cases, the remainder of the traversal and monitoring procedure for the current frame is preferably performed in the switched mode, at least until another, subsequent switch is made.

During the acquiring of frames, a user of the electron microscope system may be causing the field of view of the microscope to cover different regions of a specimen by moving the sample stage, and may periodically slow or stop the movement of the stage in order to accumulate second image frame data for specific regions of interest as they are discovered.

The electron beam of the electron microscope is caused to impinge upon a plurality of locations within a region of specimen, by way of the beam being deflected so as to perform a raster scan of the region.

A first set of particles generated within the specimen at the plurality of locations as a result of the electron beam impinging upon those locations is monitored using the first detector so as to obtain a first image frame. A second set of resulting particles generated within the specimen at the plurality of locations as a result of the electron beam impinging upon those locations is monitored using the second detector so as to obtain a second image frame. As each location is struck by the electron beam, the first and second detectors monitor respective signals derived from the first and second sets of particles for that location. Thus these steps of electron and X-ray monitoring for the region, for a given frame, are performed substantially simultaneously. The signal from each detector is used to generate an image formed of pixels arranged such that the relative locations of the pixels correspond to the relative locations within the region of the locations at which the monitored particles from which the respective pixel values were generated.

In the present example, for each pixel in the second image frame, if the configured microscope field of view is the same as that for a stored second image frame of an immediately preceding acquired compound frame in the series, said stored pixel is combined with the pixel so as to increase the signal-to-noise ratio for the pixel. Thus those parts of the second image frame that correspond to parts of the specimen also present, having been monitored under the same microscope conditions, in a preceding second image frame in the sequence are captures and propagated to the compound image frame in “accumulation” mode. Otherwise, if the fields of view are not the same, then that pixel of the second image frame is captured in “refresh” mode, and is not combined with stored pixels.

The first image frame and second image frame are combined so as to produce the compound image frame, by overlaying the two images with one another such that the visual data from both image frames can be individually distinguished and related to the relevant part of the specimen region.

Once the compound image frame has been generated, it is displayed in real-time on a visual display. In this example the compound image frame for the region is displayed 0.05 seconds after the completion of the raster scan for that region.

The above described steps are repeated for each compound image frame in the series as it is acquired.

In an electron microscope such as that of the arrangement shown in FIG. 2, there are many sources of signals that provide information on material composition or properties. Whereas the signal from a BSE detector in SEM (or annular dark field detector in STEM) is affected by the atomic number of atoms, it does not reveal any information about individual chemical element content and cannot uniquely identify a specific material present under the incident electron beam. However, an imaging camera sensitive to electrons can record an electron diffraction pattern that shows the variation in intensity of electrons with angular direction. Analysis of such a pattern can reveal properties of a crystalline material such as orientation or presence of a specific crystalline phase. If a thin specimen is being analysed, the energy spectrum for electrons transmitted through the film can be acquired with an electron energy loss spectrometer (EELS) and the presence of core loss edges in the spectrum can reveal the presence of individual chemical elements for example. An electron energy spectrometer can also be used to acquire spectra that reveal Auger emissions from a bulk sample that are characteristic of individual chemical element content. A detector sensitive to light can reveal areas where the sample is cathodoluminescent (CL) and this signal is influenced by the electronic structure of the material. An X-ray signal from a characteristic emission line from an individual chemical element can be obtained by using a crystal, diffraction grating or zone plate in a geometry that causes selective Bragg reflection of X-rays of that line energy towards a sensor sensitive to X-rays. All these are examples where the signal provides additional information on individual chemical element content or material properties that could be a useful auxiliary to an electron image from SE or BSE and could be used with the invention. However, the following description applies to the specific case where an X-ray spectrometer is used to provide additional information on chemical element content.

Figure 6:
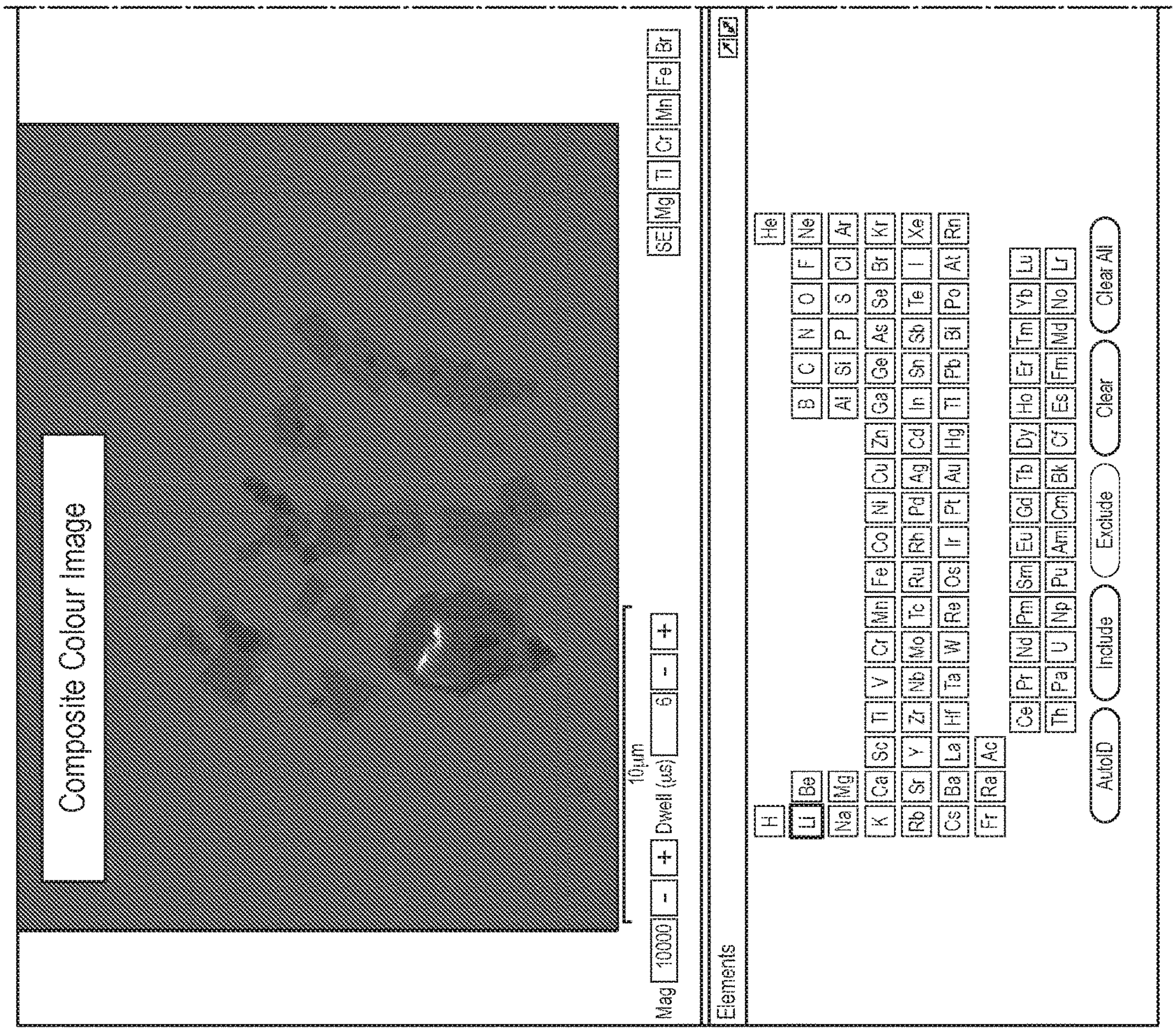
FIG. 6 is a screen capture showing the functional elements of a visual display screen for a user navigation in accordance with an example of the invention.
Figure 6:
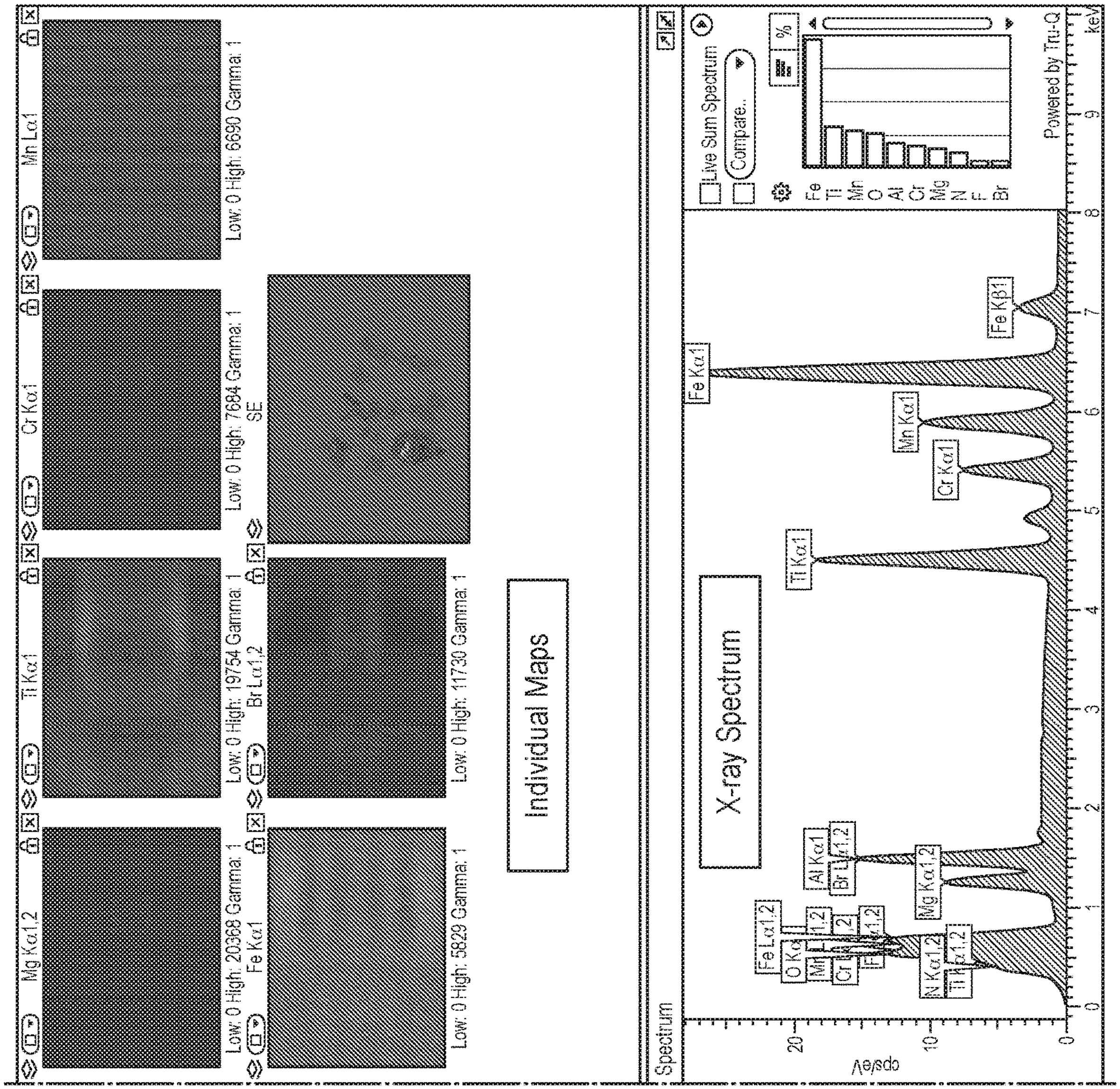

In an electron microscope it is typical to have one or more X-ray detectors and associated signal processors that enable an X-ray energy spectrum emitted by the specimen to be recorded. A histogram of photon energy measurements is recorded for the short time while the focused electron beam is deflected to a particular pixel position. The histogram is equivalent to a digital X-ray energy spectrum and the number of photons acquired that correspond to characteristic X-ray emissions for particular chemical elements can be derived from the spectrum and this gives a set of signal values corresponding to a set of chemical elements (A suitable approach for processing a digitised X-ray energy spectrum so as to minimise the effect of bremsstrahlung background and overlaps, and extract characteristic line intensities, is set out in "Deconvolution and background subtraction by least-squares fitting with prefiltering of spectra", P. J. Statham, Analytical Chemistry 1977, 49 (14), 2149-2154 DOI: 10.1021/ac50022a014). Furthermore, a signal from an electron detector (such as a secondary electron detector or a backscattered electron detector) can be recorded at that position. Thus, if the electron beam is deflected to set of pixel positions constituting one complete image frame, a set of pixel measurements can be obtained that correspond to a digital electron image and one or more images corresponding to different chemical elements. The data for these electron and X-ray images is scaled appropriately and passed to a video display unit, typically under control of a computer. FIG. 6 shows an example of a suitable display where the electron image is displayed at top left and one or more X-ray images corresponding to different chemical elements are displayed immediately to the right of the electron image so that they can be viewed at the same time that the user is concentrating on the electron image. To make it easier to view information simultaneously, the X-ray data from one or more chemical elements can be combined and displayed as a colour overlay on the electron image using techniques such as those described in PCT/GB2011/051060 or U.S. Pat. No. 5,357,110 for example and in FIG. 6, the option to display the X-ray information overlaid on the electron image can be chosen by the user using a computer mouse to position a cursor inside the box marked "Layer Map" on the display and "clicking".

When the user wants to explore the specimen to find regions of interest, the field of view needs to be moved and the method of processing and displaying the images needs to be changed to give the user real time feedback that helps them explore the specimen efficiently while the field of view is changing.

The field of view can be changed by a number of methods. The microscope magnification can be increased by reducing the current supplied to the beam deflector coils (or voltage to beam deflector plates) so that size of the region scanned on the specimen is reduced. An offset can be added to the deflection or an additional set of deflectors used to shift the region scanned on the specimen. The specimen can be physically moved by moving the holder or stage supporting the specimen to a new position relative to the electron beam axis. In all these examples, the signal data obtained would correspond to different field of view on the specimen. Furthermore, if the user changed the operating voltage for the microscope, all the signal content would change.

When the field of view is being changed, the user needs to see a result as soon as possible and that is achieved by replacing the value at a pixel with the new result of signal measurement at the corresponding beam position so that the image is refreshed with each new frame of data. A high frame rate ensures that the image will be refreshed fast enough for the user to decide whether to continue with the change of field of view. A feature has to be visible in at least two successive frames for it to be tracked so if the field of view is moving, the frame time limits the speed at which objects can be tracked. If the frame refresh time is any longer than 1 second, the user will not feel in control and may not stay focused on their train of thought. With a frame refresh time of 0.3 seconds, the user can track moving features quite well provided the feature only moves a small fraction of the screen width, but screen updates are noticeable. If the frame refresh time is less than 0.05 seconds, screen updates are hardly noticeable because of the user's persistence of vision. However, S/N is compromised at higher frame rates because the noise in an image for an individual frame will be worse when the dwell time per pixel is short. If the dwell time per pixel is increased to improve S/N, the frame time will also increase unless the number of pixels is reduced. However, reducing the number of pixels in a frame gives an image with less spatial resolution. Therefore, the dwell time per pixel and number of pixels per frame need to be optimised to suit the image signal source and the required speed of movement of the field of view.

When the field of view is moving, a short frame refresh time is highly desirable because it makes it easier for the user to track moving features and make decisions to navigate to different regions. However, when the user stops moving the field of view, the refreshed image may be noisy if a short frame time is used. Thus there is a contradicting requirement for best performance for moving and static fields of view. To overcome this contradiction we change the way data is used and switch from a "refresh" mode while the field of view is moving to an "averaging" mode when the field of view is stationary.

When the field of view is not being moved, the new result obtained when the focused electron beam returns to a particular position is now combined with the existing set of values in the corresponding pixel to improve the overall S/N ratio. The set of values may constitute an X-ray energy spectrum which is a histogram where each "bin" represents the number of photons recorded within a small range of energies or it may be a set of results of processing such a histogram to extract a set of values representing the number of photons collected from characteristic emissions of a set of chemical elements. An X-ray signal is typically the number of photons recorded in the pixel dwell time and for each value in the set of values for a particular pixel the new count can simply be added to the existing count so that the pixel value represents a total count which accumulates with every new frame of data. For display, the total count is simply divided by the number of frames for which the "averaging" mode has been used so that the intensity stays constant but the S/N improves because of the reduction in Poisson counting noise. Alternative implementations can be used to provide S/N improvement of any signal value when the system is in "averaging" mode. For example, a "Kalman" recursive filter for a particular pixel value can be described as follows:

$$Y(N) = A*S(N) + (1-A)*Y(N-1)$$

where S(N) is the signal value for the Nth incoming frame of image data, Y(N-1) is the previous value in the pixel and Y(N) is the new value for the pixel and A is less than or equal to 1. If A=1, this is effectively equal to the "refresh" mode but smaller values of A provide an averaging effect which weights the most recent result highly and previous frames with weights that decay exponentially so that the overall effect is of a long persistence screen. However, starting at a particular point in time, optimal noise reduction is obtained by changing A for each successive frame of data so that A=1/N and this produces the same S/N reduction as averaging with equal weighting over all frames.

The Kalman recursive filter is a convenient method to implement signal averaging with just a single stored image. However, alternative methods of signal averaging can be used if there is enough computer memory to save data from N new image frames in separate image stores so that data from the most recent sequence of N image frames is always available for signal averaging calculations.

A key requirement to enable a seamless transition between "refresh" and "averaging" modes is for the system to know when the user is moving the field of view. If the computer than controls signal acquisition is also aware of user requests to adjust the field of view or microscope conditions, then it can immediately decide which acquisition mode to use. Otherwise, the control computer has to deduce whether the field of view is changing. In this case, the first frame of electron image data is saved and each successive frame or partial frame of electron image data is compared to the first frame to see if it is different. As soon as a significant shift is detected (for example by observing the change in magnitude or the offset of the maximum in the cross correlation of the two image regions), then the system switches to "refresh" mode and will remain in this mode until two successive images show no significant shift when the system reverts to "averaging" mode. This type of test is ideal if the user is moving the specimen stage under the beam so that a shift of the field of view will definitely occur. It is also effective at detecting a change in magnification between two images because this will usually still produce a change in the maximum of the cross correlation result. Other tests can be used to detect changes in microscope conditions. For example, the centroid and standard deviation of a histogram of the digital image will change if the brightness or contrast is altered, as will be the case when the electron beam energy is altered by changing microscope accelerating voltage. Also, changes in focus can be detected by observing changes in the frequency distribution in the power spectrum of the digital image. Similar methods can be used to detect differences between X-ray images for a particular chemical element. Alternatively, an X-ray image can be generated that uses the signal from the total X-ray spectrum recorded at each pixel so that the image has better S/N than an image for a particular chemical element. Differences in this total X-ray spectrum image can then be used to detect changes in the field of view or conditions. The sensitivity of these tests depend on the S/N of the image and the criteria for detecting a change need to be adjusted to give the best compromise between slow response to changes and false detection when there is no change. Therefore, wherever possible, it is preferable to arrange that the computer knows when the user has intentionally changed the scanned region so that the correct mode of acquisition can be selected without having to test for image differences.

It is usually easier to detect if the field of view is being changed intentionally by the user by the user sending instructions to the SEM or from the differences in images acquired in successive scans. However, even if the user did not intend to change the field of view, that may change due to mechanical or thermal relaxation effects on the specimen stage for example. Therefore, one option is for the user to press a button to switch the mode of acquisition into the mode where successive frames of data are signal averaged or accumulated. In this mode, any unintentional drift can be corrected before the data frames are combined. If there is no capability for determining if the field of view is being intentionally changed by the user, another option is for the user to work in the fast mode of acquisition by default and have a "pause"/"resume" button that can be pressed in order to switch to slower acquisition or accumulate mode to inspect an image with better S/N before resuming the stage movement for example.

An example mode of drift correction may be applied to the method as follows.

When a sample drifts, it is possible to adjust the beam position to follow the sample and continue acquiring data as long as the acquisition area remains within the field of view. Once part of the acquisition area reaches the edge of the field of view, the beam can no longer reach all of the pixels within the acquisition area and the data integrity is reduced.

If the size of the acquisition area is close to the size of the field of view, or if the acquisition area is positioned close to one or more of the edges of the field of view, then the amount the sample can drift in certain directions before it reaches one or more of the limits of the field of view is fairly limited. To increase the amount that the sample can drift before this situation occurs, the scanning area used to acquire the data needs to be reduced to a safe region near the centre of the field of view. This safe region can be defined using the extended field mode.

When the extended field mode is selected, the maximum amount of drift allowed is defined as a percentage of the image field width. The options available include 50%, 150% and 350% of the image width in one example. This percentage is the percentage of the image width, that the sample can drift in one direction before it touches the edge of the field of view (i.e. the area that is scanned by the electron beam) on the microscope. In order to allow the sample to drift by the defined amount, the image must be reduced accordingly. As such, the higher the percentage selected, the smaller the image must be to allow it to drift by the defined percentage. This means that the images acquired after setting up drift correction with extended field mode will appear to be for a much smaller area at higher magnification than they were before.

For example, if the Maximum Drift is set to 150% of the field width, then the centre 25% of the original field of view will be used.

In some situations, where the field of view and acquisition area have been set up prior to setting up the drift correction with extended field mode, it is not ideal have the field of view reduced. In order to avoid this, a "Maintain Subject Size" option may be enabled.

When the maintain subject size option is selected, the images acquired after setting up the drift correction appear the same as they were before it was set up (i.e. they have the same magnification and cover the same area of the sample). However, in order to allow the sample to drift and the image to move by the amount set in the "Maximum Drift" field before reaching the edge of the field of view (the area that can be scanned by the electron beam) on the microscope, the field of view on the microscope must be increased. This is achieved in the background changing the magnification on the SEM.

For example, if the magnification on the SEM is initially set to 1000×, and the Maximum Drift is set to 50% of the field width, then in the background the SEM magnification is set to approximately 500×.

Whenever the field of view and microscope conditions are stationary, X-ray spectrum data is acquired for every pixel and this data accumulates as successive frames of image data are combined to improve S/N while in "averaging" mode. When a change to the field of view is introduced or detected, acquisition is going to be switched to "refresh" mode and at this point the accumulated X-ray spectrum data forms an X-ray "spectrum image" where every pixel has an associated X-ray energy spectrum for that pixel location. The sum of all pixel spectra in the field of view forms a single "sum spectrum" that can be processed to automatically identify ("Auto-ID") chemical elements from characteristic emission peaks appearing in the spectrum. The accuracy of Auto-ID can be improved by correcting the sum spectrum for pulse pile-up effects using techniques described in patent application PCT/GB2014/051555. As in PCT/GB2014/051555, clustering techniques can also be used to identify sets of pixels that have similar spectra and analysis of the sum of all the spectra from one set of similar pixels can either be used to find a matching entry in a library of spectra, or the summed spectrum analysed to quantity element compositions that can be used to match a library of compositions of known compounds so that the compound can be identified. Thus, at the point just before the field of view is altered, an X-ray spectrum image is available from the current field of view and chemical elements or even compounds can be detected within that field of view.

If the field of view is being controlled by movement of the holder or stage supporting the specimen, stage coordinates (e.g. X, Y, Z) will define the position of the field of view while the extent of the field in X and Y is defined by the beam deflection. If beam deflection is used to offset the field of view from the central position, there will be additional coordinates defining the beam deflection. The combination of stage and beam coordinates and size of the region scanned on the specimen surface are saved in a database together with the list of elements or compounds detected and if storage space allows, the entire X-ray spectrum image for that field of view.

The X-ray data typically has poor S/N compared to the electron signal data and it may be beneficial to sacrifice some of the spatial resolution of the X-ray data to achieve better S/N. For example, X-ray images may be "binned" where data from each group of neighbouring pixels is combined to give a single output pixel. Thus, the X-ray data can be converted internally to an array of pixels that have improved S/N but each pixel corresponds to a larger area on the specimen than for pixels on the resolution grid used for acquisition. Reducing the number of pixels for the internal array by binning also helps to decrease the time required to process the data to identify the chemical elements for example and therefore improves the response time. When the binned X-ray data is converted to X-ray images for display, the X-ray images will have lower spatial resolution than the electron image but will have reduced statistical noise to improve recognition of features. Reducing the resolution of the X-ray images visually minimizes the difference between the S/N ratio of the electron image and the one of the X-ray images. When the field of view is stationary and data is accumulating, the selection of the resolution of the X-ray images can be adaptive, increasing the resolution of the X-ray images as the number of accumulated frames increases and the S/N ratio improves. Even if binning is not used, the S/N of displayed X-ray images can be improved by low pass spatial filtering or "smoothing" at the cost of some blurring of image detail. Again when field of view is stationary, the degree of smoothing can be reduced as the number of accumulated frames increases.

The binning of X-ray data can be achieved by a combination of electronic and software computational methods. For example, when the beam is scanned over a conventional line-by-line grid raster pattern, rather than saving a set of values for every pixel along a line in the stored image, X-ray data can be accumulated continually while the beam moves to 4 consecutive positions to collect electron image data and then a single set of values, equivalent to aggregating the spectra from 4 separate positions on a line, is stored at every $4^{th}$ pixel along the line. If the pixel data for the same position along a line, for a series of 4 consecutive lines, are summed, the result is a single set of values representing the sum of X-ray data over a 4 by 4 array of beam positions.

Figure 5:
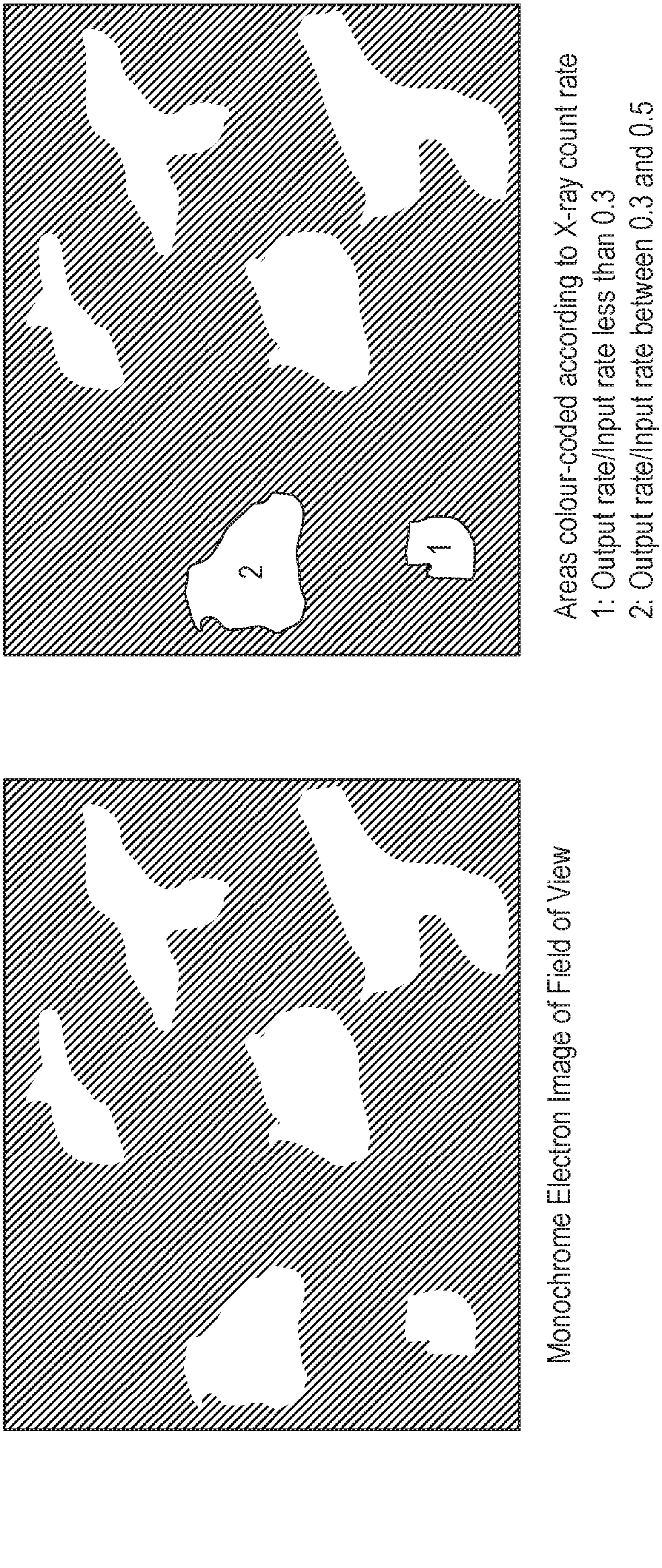
FIG. 5 shows an example compound image frames showing a region of the specimen wherein an electron image and a colour-coded X-ray image have been acquired by way of an example of the invention.

When using X-ray detection system, there is a limit to the rate that individual X-ray photons can be measured because of Poisson arrival times, hence the ratio of output count rate, OCR, to input rate, ICR, drops. When the user is moving over a large area on the specimen, the ICR may vary on different materials. If the beam current is too high, the ICR on some materials may cause the detection system to saturate and produce lower OCR than on materials with lower ICR. Therefore, the beam current needs to be set up to avoid the saturation. A visual tool that shows when the pulse processor is overloaded is useful to set the beam current appropriately so that the chemical elemental content does not exhibit any anomalies when exploring the area. FIG. 5 shows an example of a display that has been generated by monitoring the ICR and OCR at all positions within the field of view of the region on the specimen. The electron image is displayed in monochrome but when the OCR/ICR falls within a certain range, the image is coded with a colour. For example if OCR/ICR<0.3, the colour could be red and if the 0.5<OCR/ICR<0.3 the colour could be amber. Using this display, the user can adjust the beam current to make sure there are no "red" regions in a typical field of view and thus ensure that there will be no overload of the electronics in certain areas, even though the average OCR/ICR for the whole field of view may appear safe.

In typical examples, the compound image frame display shows one or more images that cover the full configured field of view in both "static" or "dynamic" modes. Even though the images are the same size, the total time to traverse the field of view to collect a new frame of data in "dynamic" mode is less than for "static mode".

Figure 7:
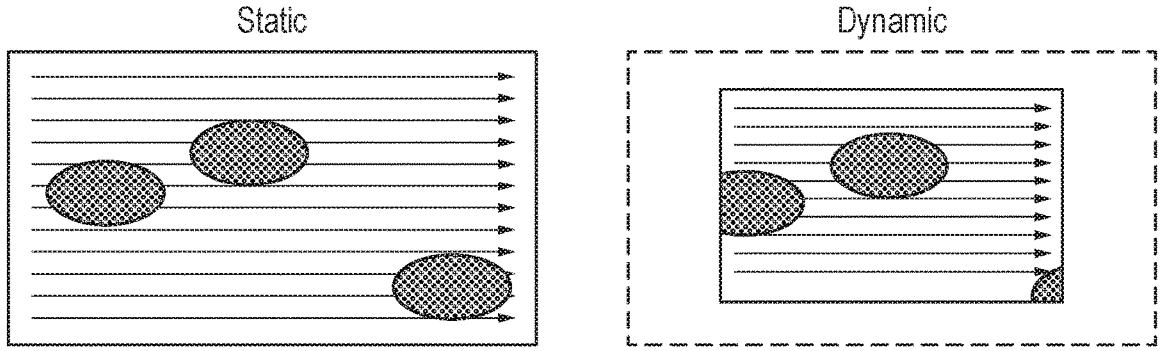
FIG. 7 schematically shows a comparison between a configured field of view and corresponding traversal path covered by a beam in a static frame acquisition mode and a modified field of view and corresponding traversal path covered by a mean in a dynamic acquisition mode according to an example of the invention.

In a further example, an alternative method to speed up the acquisition of data in a dynamic mode is employed, in particular by using a "reduced raster", as mentioned previously. With this modified scan pattern, the electron beam traverses a sub section of the configured field of view on the specimen, and only that sub section of the configured field of view is shown on the compound image frame. Thus the compound image frame has a modified field of view that is smaller than the initially configured field of view for the frame. This concept is shown in FIG. 7 where, in dynamic mode, a smaller region is scanned and only the features near the centre of the field are seen in the compound image frame display but the smaller region on the specimen can be traversed in less time and gives a faster frame rate.

In this example, the magnification is the same in both static and dynamic mode so that features visible in the central region of the display do not change in dimension when switching from static to dynamic mode. However, in dynamic mode, only a sub section of the region on the specimen is shown in the compound image frame.

The invention claimed is:

1. A method for analyzing a specimen in a microscope, the method comprising:

determining whether a configured field of view of the microscope is changing or unchanging;

acquiring a series of compound image frames from the specimen using a first detector and a second detector that is different from the first detector, wherein acquiring each of the compound image frames comprises:

causing a charged particle beam to traverse a region of the specimen corresponding to a the configured field of view of the microscope by:

traversing a first traversal path on the region according to a first set of traversal conditions in response to a determination that the configured field of view of the microscope is changing; or traversing a second traversal path on the region and according to a second set of traversal conditions in response to a determination that the configured field of view of the microscope is unchanging, wherein a first total time required for the charged particle beam to traverse the entire first traversal path according to the first set of traversal conditions is shorter than a second total time required for the charged particle beam to traverse the entire second traversal path according to the second set of traversal conditions;

monitoring a first set of resulting particles generated within the specimen at a first plurality of locations within the region using the first detector;

obtaining a first image frame comprising a plurality of pixel values derived from the monitored particles generated at one of the first plurality of locations;

monitoring a second set of resulting particles generated within the specimen at a second plurality of locations within the region using the second detector;

obtaining a second image frame comprising a plurality of pixel values each derived from the monitored particles generated at one of the second plurality of locations; and producing the compound image frame by combining the first image frame and the second image frame such that the compound image frame provides data derived from the particles generated at each of the first plurality of locations and the second plurality of locations within the region and monitored by each of the first detector and the second detector; and displaying the series of compound image frames in real-time on a visual display that is updated to show each compound image frame in sequence.

2. A method according to claim 1, further comprising:

providing functionality for a user to cause the charged particle beam to traverse the second traversal path according to the second set of traversal conditions irrespective of whether the configured field of view of the microscope is determined to be changing or unchanging.

3. A method according to claim 1, wherein, for each of at least a subset of the plurality of pixel values of the second image frame, acquiring each compound image frame further comprises:

maintaining the pixel values derived from the monitored particles for use in the compound image frame in response to a determination that the configured microscope field of view is different from that for an immediately preceding compound image frame in the series; or combining the pixel values derived from the monitored particles with derived values of a corresponding pixel of each of one or more preceding second image frames in the series to obtain a set of combined pixel values having an increased signal-to-noise ratio in response to a determination that the configured microscope field of view is the same as that for an immediately preceding compound image frame in the series.

4. A method according to claim 3, wherein maintaining the pixel values or combining the pixel values in response to the determination that the configured microscope field of view is different from or the same as that for an immediately preceding compound image frame in the series comprises:

determining whether the configured microscope field of view is different from or the same as that for an immediately preceding compound image frame in the series;

setting a frame processing mode parameter in response to the determination; and maintaining the pixel values or combining the pixel values in response to the frame processing mode parameter.

5. A method according to claim 3, wherein, in response to the determination that the configured microscope field of view is the same as that for the immediately preceding compound image frame in the series, the acquiring of each compound image frame further comprises obtaining field of view deviation data representative of a difference between an actual field of view of the microscope and a reference field of view comprising any of a configured field of view for the compound image frame being acquired and an actual field of view for a preceding compound image frame in the series; and determining the corresponding pixel of each of one or more preceding second image frames in the series in accordance with the field of view deviation data.

6. A method according to claim 1, wherein acquiring a compound image frame further comprises: processing spectrum data obtained in accordance with the second set of particles so as to obtain data indicating a quantity of particles in the second set of particles that correspond respectively to one or more characteristic line emissions, in order to derive the respective sets of values of the pixels comprised by the second image frame, wherein the processing comprises extracting the data indicating a quantity of particles when the one or more characteristic line emissions are spread over a range of energies and/or correspond to overlapping energy ranges.

7. A method according to claim 6, wherein one or more of the sets of values each comprises a set of results of processing a histogram, wherein the area of each rectangle represents a number of second particles having energies within a range of energies corresponding to the width of the rectangle, so as to extract a set of values representing the number of second particles collected from characteristic emissions of a set of chemical elements.

8. A method according to claim 1, wherein the first detector is an electron detector and the second detector is any of: an X-ray detector disposed between a beam source and the specimen and having one or more sensor portions facing the specimen and at least partly surrounding the incident charged particle beam, an X-ray spectrometer, an electron diffraction pattern camera, an electron energy loss spectrometer, and a cathodoluminescence detector.

9. A method according to claim 1, wherein the first traversal path has a length that is shorter than that of the second traversal path, such that the first total time is less than the second total time.

10. A method according to claim 1, wherein the first and second sets of traversal conditions are configured such that the beam is caused to traverse the first traversal path at an average rate that is faster than that at which the beam is caused to traverse the second traversal path, such that the first total time is less than the second total time.

11. A method according to claim 10, wherein:

the first and second sets of traversal conditions are configured such that: a first linear density, along the first traversal path, of locations within the region for which the first set of generated particles are configured to be monitored, is less than a second linear density, along the second traversal path, of locations within the region for which the first set of generated particles are configured to be monitored, and a first linear density, along the first traversal path, of locations within the region for which the second set of generated particles are configured to be monitored, is less than a second linear density, along the second traversal path, of locations within the region for which the second set of generated particles are configured to be monitored; or wherein the first and second sets of traversal conditions are configured such that a first configured monitoring duration for which the first set of particles generated at each of the first plurality of locations along the first traversal path is monitored is less than a second configured monitoring duration for which the first set of particles generated at each of the first plurality of locations along the second traversal path is monitored, and a first configured monitoring duration for which the second set of particles generated at each of the second plurality of locations along the first traversal path is monitored is less than a second configured monitoring duration for which the second set of particles generated at each of the second plurality of locations along the second traversal path is monitored.

12. A method according to claim 1, wherein the first traversal path covers a modified field of view that is contained within or contains the configured field of view.

13. A method according to claim 1, wherein, for each of the plurality of pixels comprised by the second image frame, the acquiring of each compound image frame further comprises:

switching from traversing the second traversal path according to the second set of traversal conditions to traversing the first traversal path according to the first set of traversal conditions in response to a determination that the configured microscope field of view is different from that for an immediately preceding pixel of the second image frame; or switching from traversing the first traversal path according to the first set of traversal conditions to traversing the second traversal path according to the second set of traversal conditions in response to a determination that the configured microscope field of view is the same as that for the immediately preceding pixel of the second image frame.

14. A method according to claim 13, wherein the switching is performed prior to monitoring particles generated within the specimen at a location within the region corresponding to an immediately subsequent pixel in the second image frame.

15. A method according to claim 13, wherein switching from the second traversal path to the first traversal path or from the first traversal path to the second traversal path in response to the determination that the configured microscope field of view is different from or the same as that for an immediately preceding pixel of the second image frame comprises:

determining whether the configured microscope field of view is different from or the same as that for an immediately preceding pixel of the second image frame;

setting a scan mode parameter in response to the determination; and switching from the second traversal path to the first traversal path or from the first traversal path to the second traversal path in response to the scan mode parameter.

16. A method according to claim 1, wherein, for each of the plurality of pixel values of the first image frame, acquiring each compound image frame further comprises:

maintaining the pixel values derived from the monitored particles for use in the compound image frame in response to a determination that the configured microscope field of view is different from that for an immediately preceding compound image frame in the series; or combining the pixel values derived from the monitored particles with derived values of a corresponding pixel of each of one or more preceding first image frames in the series to obtain a combined pixel value having an increased signal-to-noise ratio in response to a determination that the configured microscope field of view is the same as that for an immediately preceding compound image frame in the series.

17. A method according to claim 16, wherein maintaining the pixel values or combining the pixel values in response to the determination that the configured microscope field of view is different from or the same as that for an immediately preceding compound image frame in the series comprises:

determining whether the configured microscope field of view is different from or the same as that for an immediately preceding compound image frame in the series;

setting a frame processing mode parameter in response to the determination; and maintaining the pixel values or combining the pixel values in response to the frame processing mode parameter.

18. A method according to claim 1, wherein acquiring a compound image frame further comprises:

grouping together the pixel value sets of one or more subsets of pixels in the second image frame so as to obtain one or more respective sets of aggregate pixel values, replacing each of the one or more subsets of pixels in the second image frame with an aggregate pixel having a set of values equal to the respective set of aggregate pixel values.

19. A method according to claim 1, wherein monitoring the second set of particles so as to obtain the second image frame comprises: deriving two or more signals of different types from the second detector, so as to obtain a sub-image frame corresponding to each of said signals, and wherein combining the first image frame and second image frame comprises combining the first image frame with one or more of said sub-image frames.

20. An apparatus for analyzing a specimen in a microscope, the apparatus comprising:

an X-ray detector;

a processor; and non-transitory computer readable storage media storing a computer program that, when executed by the processor, causes the processor to carry out the method according to claim 1.

21. Non-transitory computer readable storage media storing a computer program that, when executed by a hardware computer processor, causes an apparatus to perform the method according to claim 1.

22. A method according to claim 1, wherein determining whether the configured field of view of the microscope is changing or unchanging and traversing the region in response to the determination comprises:

determining whether the configured field of view of the microscope is changing or unchanging;

setting a scan mode parameter in response to the determination; and traversing the region in accordance with the scan mode parameter.

* * * * *